(12) United States Patent
Kawabata et al.

(10) Patent No.: US 8,354,902 B2
(45) Date of Patent: Jan. 15, 2013

(54) STRUCTURE OF SPRING AND ACTUATOR USING THE SPRING

(75) Inventors: Yasuhiro Kawabata, Nara (JP); Yusuke Yamaji, Nara (JP); Hiroyuki Tanaka, Yamaga (JP); Tomomi Serikawa, Yamaga (JP); Tatsuo Shinoura, Koshi (JP)

(73) Assignee: OMRON Corporation, Kyoto (JP)

( * ) Notice: Subject to any disclaimer, the term of this patent is extended or adjusted under 35 U.S.C. 154(b) by 151 days.

(21) Appl. No.: 12/712,971

(22) Filed: Feb. 25, 2010

(65) Prior Publication Data

US 2010/0295639 A1 Nov. 25, 2010

(30) Foreign Application Priority Data

May 20, 2009 (JP) ................. 2009-121761

(51) Int. Cl.
*H01H 51/22* (2006.01)
(52) U.S. Cl. ............. 335/78; 335/106; 200/181
(58) Field of Classification Search ........ 335/78, 335/106; 200/181; 267/158–160
See application file for complete search history.

(56) References Cited

U.S. PATENT DOCUMENTS

| | | | | |
|---|---|---|---|---|
| 6,115,231 A * | 9/2000 | Shirakawa | ............ | 361/233 |
| 6,714,105 B2 * | 3/2004 | Eliacin et al. | ............ | 333/262 |
| 7,053,736 B2 * | 5/2006 | Nelson | ............ | 335/70 |
| 7,242,273 B2 * | 7/2007 | Isobe et al. | ............ | 335/78 |
| 7,420,447 B2 * | 9/2008 | Ruan et al. | ............ | 335/78 |
| 7,446,634 B2 * | 11/2008 | Jeong et al. | ............ | 335/78 |
| 2002/0149071 A1 | 10/2002 | Shim | | |
| 2003/0103717 A1 | 6/2003 | Aksyuk et al. | | |
| 2005/0012562 A1 | 1/2005 | Shin | | |
| 2006/0132891 A1 | 6/2006 | Kim et al. | | |
| 2006/0244555 A1 | 11/2006 | Janot et al. | | |

FOREIGN PATENT DOCUMENTS

| | | |
|---|---|---|
| JP | 2002-254339 A | 9/2002 |
| JP | 2002-326197 A | 11/2002 |
| JP | 2005-005267 A | 1/2005 |
| JP | 2005-216552 A | 8/2005 |
| JP | 2006-173132 A | 6/2006 |
| JP | 2006-190594 A | 7/2006 |
| JP | 2006-523001 | 10/2006 |

* cited by examiner

*Primary Examiner* — Bernard Rojas
(74) *Attorney, Agent, or Firm* — Osha Liang LLP

(57) ABSTRACT

A structure of a spring has a supporting member, an actuating member that is rotatably supported to the supporting member by a first supporting axis at a portion near a center, and a plurality of interlocking members that are each provided on both sides of the first supporting axis, that are rotatably supported to the supporting member by a second supporting axis, and that are rotatably coupled to the actuating member. Each point of action of the interlocking members is defined at a portion that is closer to the first supporting axis than to the coupled portion of the second supporting axis and the actuating member.

11 Claims, 26 Drawing Sheets

STRUCTURE OF SPRING AND ACTUATOR USING THE SPRING

BACKGROUND OF THE INVENTION

1. Technical Field

The present invention relates to a structure of a spring and an actuator using this spring. Specifically, the present invention relates to a structure of a spring in a leaf spring shape, and an actuator such as a relay or a mirror device using this spring.

2. Related Art

To date, various structures have been proposed as a small sized actuator, in particular, an MEMS (Micro-Electro Mechanical System) device, using a leaf spring.

(Japanese Unexamined Patent Publication No. 2002-326197)

For example, according to an MEMS device described in Japanese Unexamined Patent Publication No. 2002-326197, two signal lines are disposed on a substrate so that ends of the signal lines face each other, and fixed electrodes are provided on both sides of the signal lines so as to sandwich both the signal lines. Further, a drive electrode faces so as to face each fixed electrode above the substrate, and a contact portion (contact switching portion) provided between the both drive electrodes faces the each end of the both signal lines (contact pair) so as to be able to be in contact with and separated from the ends of the both signal lines. The drive electrode and the contact portion are elastically supported above the substrate by a spring.

According to this MEMS device, when closing between the signal lines to permit conduction, an electrostatic attractive force is produced between the drive electrode and the fixed electrode and the drive electrode is attracted to the fixed electrode, thereby bringing the contact portion into electrical contact with each end of the both signal lines.

However, according to the structure shown in Japanese Unexamined Patent Publication No. 2002-326197, only a single pair of contact pair can be switched, and a c contact structure cannot be adopted. Specifically, it is not possible to provide a structure including a common contact (c contact) and a pair of contacts (a contact and b contact), and in which switching between the a contact and the c contact and switching between the b contact and the c contact are alternately carried out.

(Japanese Unexamined Patent Publication No. 2006-190594)

A micro contact switching device disclosed in Japanese Unexamined Patent Publication No. 2006-190594 is able to carry out switching of a plurality of pairs of contact pair. Specifically, according to the micro contact switching device described in Japanese Unexamined Patent Publication No. 2006-190594, a center of a band plate-shaped flexible micro movable portion is unfixedly supported by a fulcrum portion, and an upper electrode that faces a lower electrode on the substrate and a moving contact that faces a pair of fixed contacts (fixed contact pair) on the substrate are respectively provided on both end portions of the micro movable portion.

This micro contact switching device has a structure such that, a voltage to one of the upper electrode and the lower electrode is applied to cause the both electrodes to be attracted to each other, and the micro movable portion is caused to be inclined or flexed, and thereby bringing the moving contact that is close to the electrodes into contact with the fixed contact pair.

According to the micro contact switching device of this structure, it is possible to provide the structure as the c contact structure by electrically connecting one fixed contact of one fixed contact pair and one fixed contact of the other fixed contact pair by wiring.

However, according to the micro contact switching device disclosed in Japanese Unexamined Patent Publication No. 2006-190594, the following action is carried out to switch the fixed contact pairs on the right and left. For example, a case is assumed in which the upper electrode and the lower electrode on the right side are attracted and the moving contact on the right side is in contact with the fixed contact pair, thereby closing between the fixed contact pair. When the switch of the fixed contact pair is switched in this state, it is required that the attraction between the upper electrode and the lower electrode on the right side is released and then the moving contact on the right side is separated from the fixed contact pair, and the upper electrode and the lower electrode on the left side are attracted and the moving contact on the left side is brought into contact with the fixed contact pair. However, as the micro movable portion has flexibility, if the timing at which the attraction between upper electrode and the lower electrode on the right side is released comes after the timing at which the upper electrode and the lower electrode on the left side are attracted, both the moving contact on the right side and the moving contact on the left side are brought into contact with the fixed contact pair (see FIG. 1D in Japanese Unexamined Patent Publication No. 2006-190594), and a short circuit is caused between the a contact and the b contact. Therefore, in order to carry out switching between the right and left contacts quickly, it becomes difficult to control the timings for attracting and separating the upper electrodes and the lower electrodes on the left and the right sides, respectively.

Further, even if it is possible to provide the c contact structure, according to the micro contact switching device of Japanese Unexamined Patent Publication No. 2006-190594, as the fulcrum portion is provided at the center of the micro movable portion, it is necessary to wire the c contact around the fulcrum portion for a long distance. This can lead to a poor high frequency characteristic and inappropriateness for an application of switching high-frequency signals.

(Japanese Unexamined Patent Publication No. 2005-5267)

An MEMS switch disclosed in Japanese Unexamined Patent Publication No. 2005-5267 also has a structure such that an upper electrode and a lower electrode are attracted by an electrostatic attractive force between the upper electrode and the lower electrode, and a gap in a transmission line is switched using first and second contact portions provided for both ends of a supporting base supported in seesaw relation. According to this MEMS switch, the gap in the transmission line is closed by the contact portion on a side where the upper electrode is attracted to the lower electrode, and the gap in the transmission line on the other side is forcibly opened, and therefore reliability when opening the gap in the transmission line can be improved. Further, the transmission line is configured to form the c contact structure.

However, according to this MEMS switch, the first contact portion and the gap therebelow (the a contact and the c contact) and the second contact portion and the gap therebelow (the b contact and the c contact) are distant in both sides with the supporting base therebetween. Therefore, the c contact is wired for a long distance, resulting in a poor high frequency characteristic of the MEMS switch. Further, a movement stroke of the first and second contact portion is substantially equal to an end portion stroke of the supporting base when the supporting base swings, and it is not possible to increase the movement stroke of the first and second contact portion larger than this.

(Japanese Unexamined Patent Publication No. 2006-173132)

According to an MEMS switch disclosed in Japanese Unexamined Patent Publication No. 2006-173132, an inner actuating member and an outer actuating member are supported in seesaw relation above a substrate, and the inner actuating member is inclined to either direction by an electrostatic attractive force acting between the inner actuating member and the first or second fixed electrode on the substrate. The outer actuating member has a structure such that the outer actuating member is inclined in conjunction with the inner actuating member by being pressed by a pressure application rod of an inner swinging member, and the gap between a first and a second signal line is switched by a first and a second contact member provided on both ends of the outer actuating member. According to this MEMS switch, the gap between the first or second signal line is closed by the first or second contact member on a side where the inner actuating member is attracted to the first or second fixed electrode, and the gap between the first or second signal line on the other side is forcibly opened, and therefore reliability when opening the gap in the transmission line can be improved.

According to the MEMS switch having a structure as described in Japanese Unexamined Patent Publication No. 2006-173132, a portion of the signal line can be configured as the c contact structure by connecting one contact of the first signal line and one contact of the second signal line.

However, even with this MEMS switch, as the first contact member and the gap therebelow (the a contact and the c contact) and the second contact member and the gap therebelow (the b contact and the c contact) are respectively positioned at the ends of the outer actuating member, the c contact is wired for a long distance, resulting in a poor high frequency characteristic of the MEMS switch. Further, the movement stroke of the first and the second contact member is substantially equal to an end portion stroke of the outer actuating member when the outer actuating member swings, and it is not possible to increase the movement stroke of the first and second contact portion larger than this.

(Japanese Unexamined Patent Publication No. 2005-216552)

A micro relay disclosed in Japanese Unexamined Patent Publication No. 2005-216552 is such that an armature is driven using an electromagnet. Specifically, according to this micro relay 11, as shown in FIG. 1, both end portions of a thin film 13 of a base substrate 12 are respectively provided with pairs of fixed contacts 14a, 14c and 14b, 14c. An electromagnet 15 is contained within a hollow portion provided in the base substrate 12 at a lower surface of the thin film 13. On an armature block 16 provided over the base substrate 12, the armature 17 is rotatably supported to a frame portion 19 by projecting pieces 18 provided on both side surfaces of an armature 17, and moving contact base portions 20 provided for both end portions of the armature 17 are supported to the armature 17 by compression spring portions 21. Then, when the armature block 16 is provide over an upper surface of the base substrate 12, a moving contact of a lower surface of one of the moving contact base portions 20 faces the fixed contacts 14a, 14c, and a moving contact of a lower surface of the other of the moving contact base portions 20 faces the fixed contacts 14b, 14c.

According to the micro relay 11, when the electromagnet 15 is excited, one of the end portions of the armature 17 is attracted to the electromagnet 15 depending on the polarity at that time, thereby causing the armature 17 to be inclined. Then, the moving contact of the lower surface of the moving contact base portion 20 positioned on the attracted side closes one of the fixed contacts 14a, 14c and the fixed contacts 14b, 14c.

According to the micro relay 11, the fixed contacts 14c, 14c on the both ends are connected through the side of the thin film 13 to form the c contact structure. However, as shown in FIG. 2, the fixed contact 14c as the c contact extends over substantially an entire length of the base substrate 12, the high frequency characteristic of the micro relay 11 becomes poor and it is hard to design for the high-frequency application. Further, in the micro relay 11, the movement stroke of the moving contact (the moving contact base portion 20) is substantially equal to an end portion stroke of the armature 17 when the armature 17 swings, and it is not possible to increase the movement stroke of the moving contact larger than this.

(Japanese Unexamined Patent Publication (Translation of PCT Application) No. 2006-523001)

An electromagnetic relay 31 disclosed in Japanese Unexamined Patent Publication (Translation of PCT Application) No. 2006-523001 has a structure such that, as shown in FIG. 3, a contact element supporting body 33 in a leaf spring shape, a contact terminal 34, and an electromagnet (not shown) are layered on a printed circuit card 32. As shown in FIG. 4, conductor paths 35a, 35b, and 35c are formed on an upper surface of the printed circuit card 32, and the conductor paths 35a and 35b are disposed on right and left sides of an end portion of the conductor path 35c. A base portion of the contact element supporting body 33 is flexed, a pair of flexible arms 36 and 37 extends from the base portion, and a contact element 38 is provided on a lower surface of a tip end portion of the flexible arms 36 and 37. The contact terminal 34 is rotatably supported by an axis 39 so that the right and left portions of the contact terminal 34 swing up and down, and it can be switched between a state in which the right portion is lowered and a state in which the left portion is lowered, by the electromagnet. Then, when the left portion of the contact terminal 34 is lowered, a projecting portion 40 of the flexible arm 36 is pressed by the contact terminal 34 and a tip end of the flexible arm 36 is lowered, and the conductor paths 35a and 35c are closed therebetween by the contact element 38. In contrast, when the right portion of the contact terminal 34 is lowered, the projecting portion 40 of the flexible arm 37 is pressed by the contact terminal 34, and a tip end of the flexible arm 37 is lowered, and the conductor paths 35b, 35c are closed therebetween by the contact element 38.

As the electromagnetic relay 31 has the c contact structure and a length of the conductor path 35c as the c contact is made short, the electromagnetic relay 31 is appropriate for the high-frequency application.

However, with the structure of the electromagnetic relay 31 according to Japanese Unexamined Patent Publication (Translation of PCT Application) No. 2006-523001, the contact terminal 34 is driven by the electromagnet, and the flexible arms 36, 37 of the contact element supporting body 33 are moved by the contact terminal 34, thereby switching the contacts (the conductor paths 35a, 35b, and 35c). When a driving portion is configured by two members (the contact element supporting body 33 and the contact terminal 34) as described above, assembly accuracy and the like of the electromagnetic relay 31 decreases, carrying out a correct relay operation becomes difficult, and downsizing of the electromagnetic relay 31 becomes difficult. Further, according to this electromagnetic relay 31, as the movement stroke of the moving contact (the contact element 38) is substantially equal to a stroke of a free end of the flexible arms 36, 37, it is not possible to increase the movement stroke of the moving contact. Further, as a dissociating force of the moving contact is only an elastic restoring force of the flexible arms 36, 37, it is not possible to use for an actuator that needs the dissociating force of the moving contact.

(Japanese Unexamined Patent Publication No. 2002-254399)

FIG. 5A is a plan view illustrating a mirror device of the conventional example, FIG. 5B is a cross-sectional view taken along a line X-X in FIG. 5A, and FIG. 5C is a cross-sectional view taken along a line in Y-Y in FIG. 5A. A mirror device 41 in the figure is such that a mirror 43 in a disc shape is disposed horizontally above a substrate 42, and both ends of the mirror 43 are supported by springs 44 that are meanders in a zig-zag manner. Lower electrodes 45 are provided on both sides of the line segment that connects the springs 44 on an upper surface of the substrate 42 so as to face a lower surface of the mirror 43, and upper electrodes 46 are formed on the lower surface of the mirror 43 that faces the lower electrodes 45. According to the mirror device 41, when a potential difference is applied between the upper electrodes 46 and the lower electrodes 45 on either side, the potential difference applied upper electrode 46 is attracted to the lower electrode 45 to cause the mirror 43 to be inclined. An example of such a mirror device includes the one disclosed in Japanese Unexamined Patent Publication No. 2002-254399.

In order to increase the electrostatic attractive force between the upper electrode 46 and the lower electrode 45 for the mirror device 41 of such a structure, an inclination of a surface on which the upper electrode 46 is provided can be reduced, and the mirror 43 can be disposed closer to the substrate 42. In this case, however, an inclination of the mirror 43 is limited and becomes smaller. In contrast, in order to increase the inclination of the mirror 43, the inclination of the surface on which the upper electrode 46 is provided can be increased, or the mirror 43 can be disposed away from the substrate 42. In this case, however, as a distance between the upper electrode 46 and the lower electrode 45 increases, the electrostatic attractive force for inclining the mirror 43 becomes small. Therefore, it is difficult to increase the inclination of the mirror 43 with the mirror device 41 of this type.

SUMMARY

One or more embodiments of the present invention provides a structure of a spring that includes at least one pair of points of action and can be manufactured by a single member, where a distance between the points of action of the pair can be reduced, and a driving force of the points of action can be increased. Further, one or more embodiments of the present invention provides a structure of a spring with which a movement stroke of the points of action can be increased, or an inclination of the points of action can be increased.

In accordance with one aspect of the present invention, a structure of a spring includes: a supporting member; an actuating member that is rotatably supported to the supporting member by a first supporting axis at a portion near a center; and a plurality of interlocking members that are each provided on both sides of the first supporting axis, that are rotatably supported to the supporting member by a second supporting axis, and that are rotatably coupled to the actuating member, each point of action of the interlocking members being defined at a portion that is closer to the first supporting axis than to the coupled portion of the second supporting axis and the actuating member.

According to the structure of the spring according to one or more embodiments of the present invention, it is possible to act (displace) the points of action of the interlocking members by applying a force to the actuating member to move in seesaw relation. In addition, as the points of action can be acted near the first supporting axis, it is possible to decrease the distance between the points of action of the interlocking members positioned on the both sides of the first supporting axis. Further, as the actuating member and the interlocking members of the spring are rotatably coupled and the interlocking members can be moved directly by the force applied to the actuating member, it is possible to drive the points of action by a strong force.

Further, according to the structure of the spring according to one or more embodiments of the present invention, by changing a distance between the first supporting axis and the second supporting axis, it is possible to increase or decrease the movement stroke of the points of action, or increase or decrease the driving force of the points of action, thereby allowing an easy design variation of the spring. Similarly, by changing the distance between the first supporting axis and the second supporting axis, an easy design variation of an angle of the points of action is possible by increasing or decreasing an inclination angle of the points of action when the interlocking members are inclined.

Further, according to the structure of the spring according to one or more embodiments of the present invention, as it is possible to integrally manufacture the supporting member, the actuating member, the interlocking members and the like, the spring can be manufactured with a single member, thereby facilitating a manufacture, and a mount of the spring to a device as well as an adjustment of the spring.

According to the structure of the spring according to one or more embodiments of the present invention, the interlocking members can be rotatably supported to the supporting member at the portion that is closer to the first supporting axis than to the coupled portion to the actuating member. Further, according to the structure of the spring according to one or more embodiments of the present invention, the interlocking member can be rotatably supported to the supporting member at a portion that is distant from the coupled portion to the actuating member, taking the first supporting axis as a reference. According to the former structure, when the actuating member is inclined by applying the force to one end portion of the actuating member, the both interlocking members are inclined to the same direction as the actuating member, and the point of action of the interlocking member on the side to which the force is applied is displaced to a direction opposite of the one end portion of the actuating member, and the point of action of the interlocking member on the opposite side is displaced to the same side as the one end portion of the actuating member. Further, according to the latter structure, when the actuating member is inclined by applying the force to one end portion of the actuating member, the both interlocking members are inclined to the direction opposite of the actuating member, and the point of action of the interlocking member on the side to which the force is applied is displaced to the same side as the one end portion of the actuating member, and the point of action of the interlocking member on the opposite side is displaced to the direction opposite of the one end portion of the actuating member. Accordingly, it is possible to change the action of the points of action depending on positional relation of the coupled portions between the first supporting axis, the second supporting axis, the actuating member, and the interlocking members.

According to a different aspect of the structure of the spring according to one or more embodiments of the present invention, at least one of areas: an area in which the interlocking members are coupled to the actuating member, an area in which the actuating member is supported by the first supporting axis, or an area in which the interlocking member is supported by the second supporting axis, is configured as a reinforcement portion, a thickness of the reinforcement portion being made thicker than a thickness of the area other than the reinforcement portion. According to this aspect, as it is possible to increase mechanical rigidity of the portion at which the reinforcement portion is formed, the portion at which the reinforcement portion is formed is not easily flexed and deformed by an external force, thereby stabilizing the action of the spring.

Moreover, in a case in which each of the interlocking members includes: an interlocking member main body whose one end is rotatably coupled to the actuating member and the other end is supported to the supporting member by the second supporting axis; and a point-of-action spring portion whose point of action is defined at the one end, the reinforcement portion that is thicker than the thickness of the area other than the reinforcement portion can be formed at the coupling area between the interlocking member main body and the point-of-action spring portion. According to this aspect, as it is possible to increase mechanical rigidity of the coupling area of the interlocking member main body and the point-of-action spring portion, the area is not easily flexed and deformed by the external force, thereby stabilizing the action of the spring.

Further, according to the aspect in which the thick reinforcement portion is used, the spring is manufactured with an SOI substrate, the reinforcement portion is manufactured using an entire thickness of the SOI substrate, and the other area is manufactured using a part of the thickness of the SOI substrate. In this case, it is possible to easily manufacture the spring whose thickness is partially different using an MEMS technique.

According to a further different aspect of the structure of the spring according to one or more embodiments of the present invention, each of the interlocking members includes an elastic extending and contracting portion that elastically expands and contracts in the middle of the coupled portion to the actuating member and the second supporting axis. According to the spring according to one or more embodiments of the present invention, as a distance between the coupled portion between the actuating member and the interlocking member and the second supporting axis is different from a distance between the coupled portion between the actuating member and the interlocking member and the first supporting axis, a tensile stress or a compressive stress is produced in the actuating member and interlocking members when the actuating member is applied with the force and inclined, and the actuating member or the interlocking members can be deformed or damaged. In contrast, according to this aspect, the interlocking members are provided with the elastic expanding and contracting portions, and it is possible to absorb the tensile stress or the compressive stress produced in the actuating member and the interlocking members with the elastic expanding and contracting portions. Therefore, it is possible to prevent the actuating member and the interlocking members from being damaged, as well as to facilitate the action of the actuating member and the interlocking members.

According to a still further different aspect of the structure of the spring according to one or more embodiments of the present invention, the spring is in a symmetric structure with respect to the first supporting axis, and in a symmetric structure with respect to a line segment that extends in a direction orthogonal to the first supporting axis. According to this aspect, the action of the spring can be stabilized. In particular, it is possible to equalize the action of the points of action provided on the both sides of the first supporting axis.

In accordance with another aspect of the present invention, an actuator includes: the spring according to one or more embodiments of the present invention; and a driving source that drives the actuating member of the spring to rotate about the first supporting axis. According to such an actuator, it is possible to use the same as a mirror device by providing a mirror at the points of action. In addition, the movement stroke of the points of action and the inclination of the interlocking members can be easily changed only by changing the position of the second supporting axis, thereby allowing easy design variation of the actuator.

Further, as it is possible to form the spring in an integral structure, assembly and adjustment of the actuator can be facilitated.

In accordance with still another aspect of the present invention, a relay includes: the spring according to one or more embodiments of the present invention; a driving source that drives the actuating member of the spring to rotate about the first supporting axis; a plurality of moving contacts that are provided for an area serving as the point of action of the spring; a first fixed contact that is provided at a position that faces one of the moving contacts; a second fixed contact that is provided at a position that faces another one of the moving contacts; and a third fixed contact that is provided at a position that faces both of the adjacent moving contacts.

According to the relay according to one or more embodiments of the present invention, as it is possible to manufacture a relay of a c contact structure and to decrease a length of the third fixed contact (c contact, common contact), favorable high frequency characteristic of the relay can be provided. Accordingly, it is possible to provide a best suited structure for the high frequency relay.

Further, as the points of action can be moved by a strong force, the moving contact is not easily fixed to the first to the third fixed contact, thereby preventing a failure in switching between the fixed contacts.

Further, as it is possible to form the spring in an integral structure, assembly and adjustment of the relay can be facilitated.

DETAILED DESCRIPTION

Hereinafter, preferred embodiments of the present invention will be described with reference to the drawings. However, the present invention is not limited to the embodiments described below, and various design variation can be made without departing from the spirit of the present invention. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

(First Embodiment)

Figure 1:
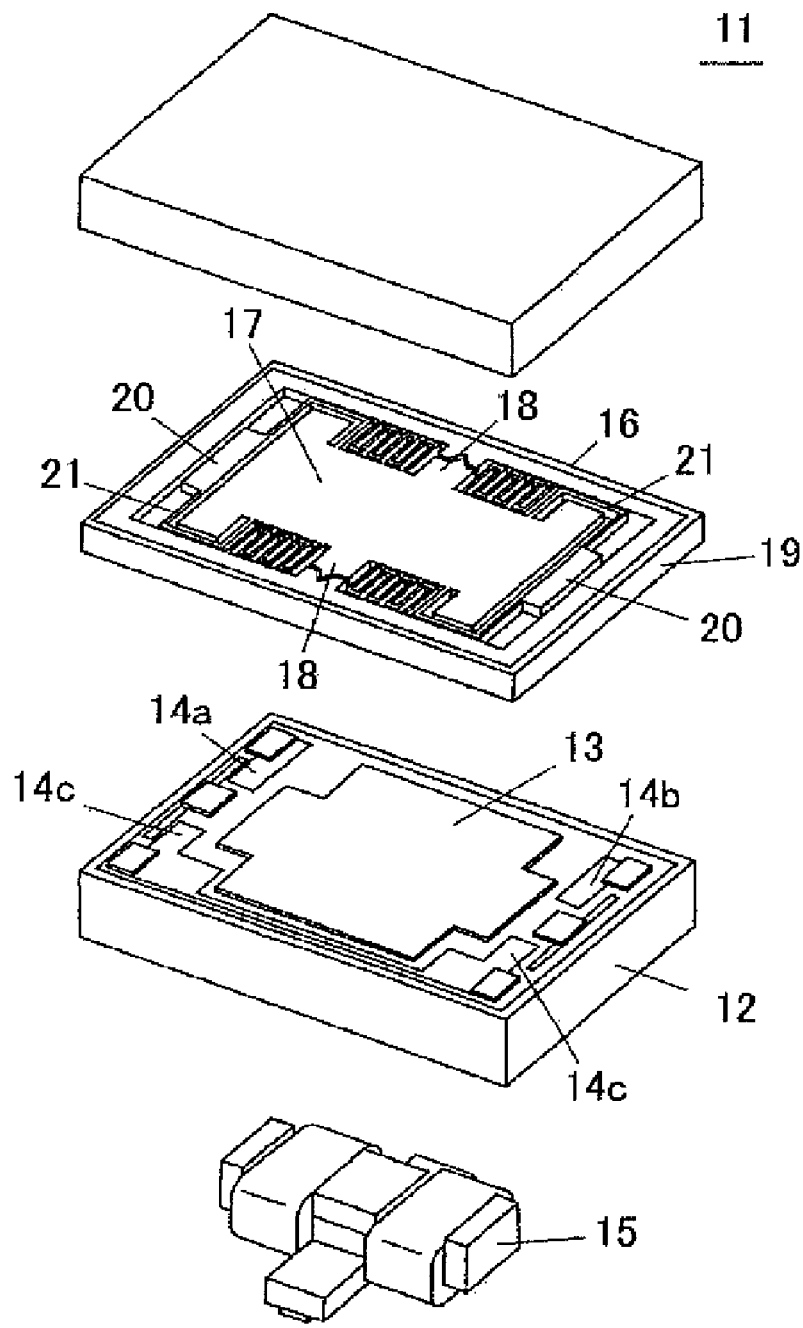
FIG. 1 is an exploded perspective view illustrating a micro relay disclosed in Japanese Unexamined Patent Publication No. 2005-216552.
Figure 2:
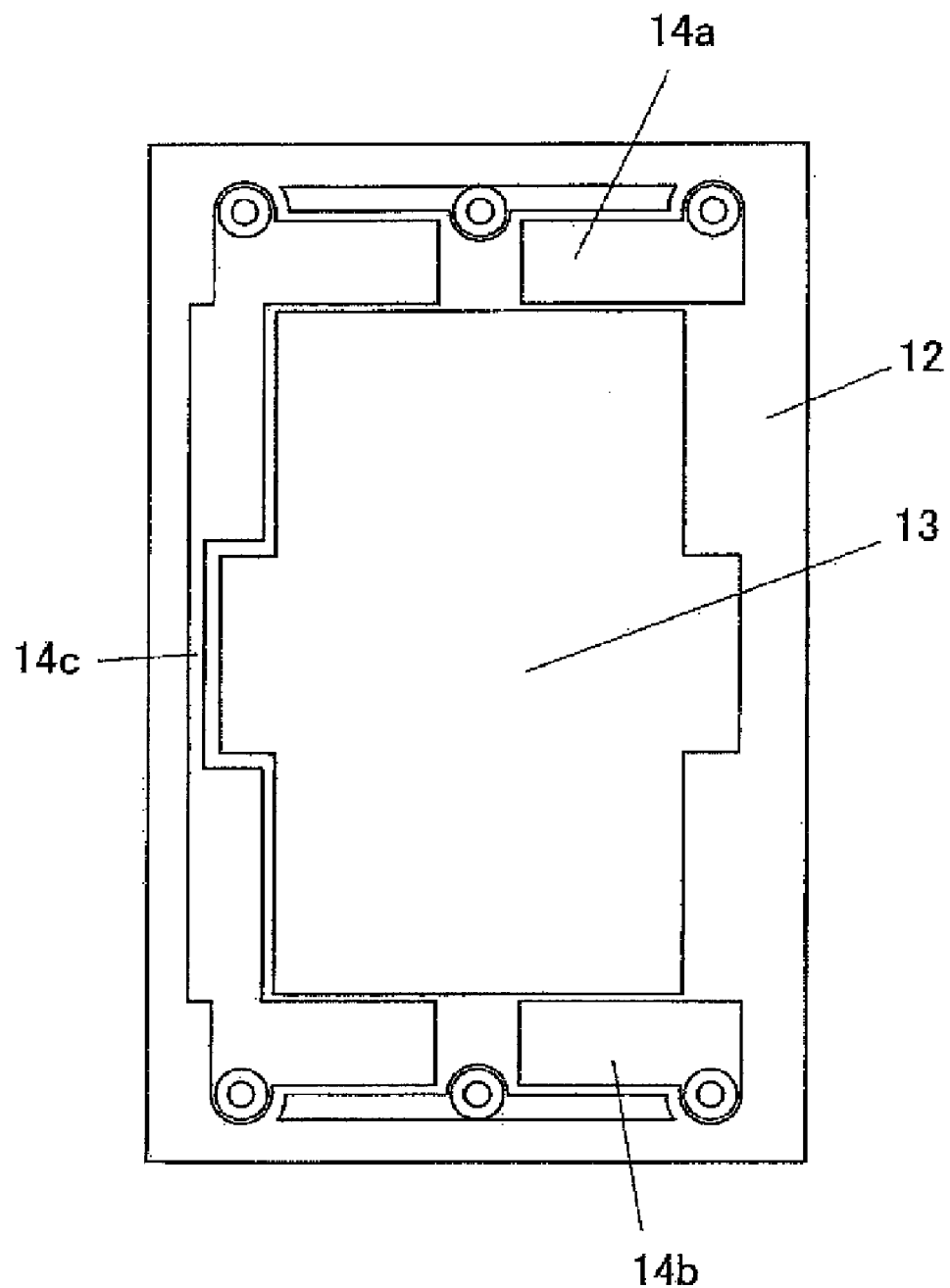
FIG. 2 is a plan view illustrating a base substrate used for the micro relay.
Figure 3:
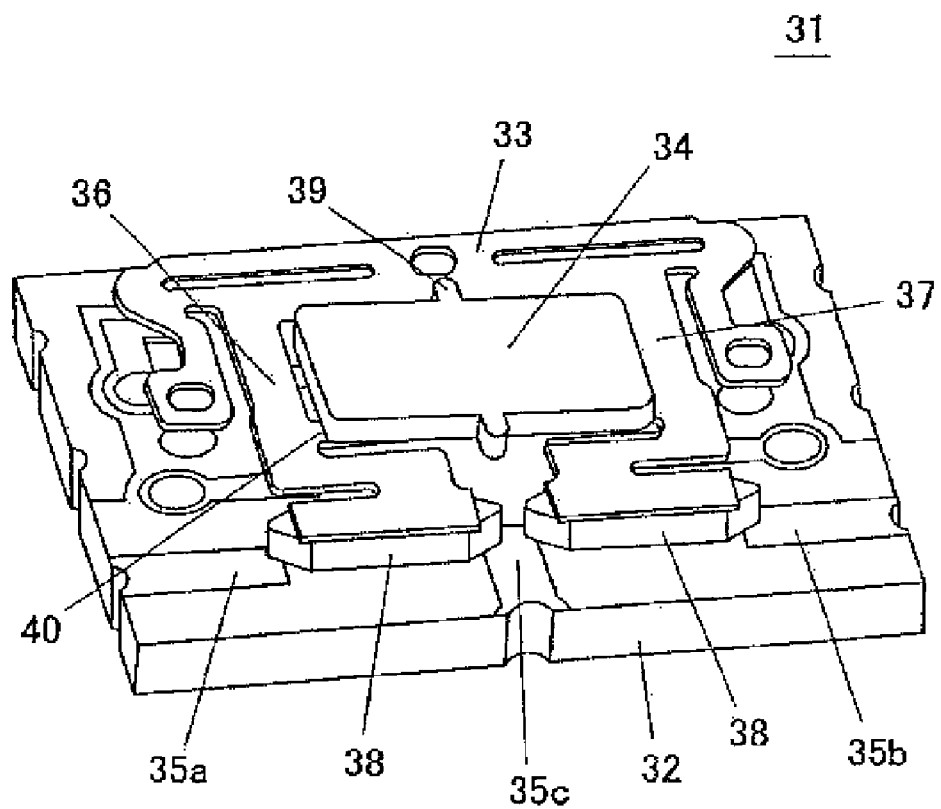
FIG. 3 is a perspective view of a main portion of an electromagnetic relay disclosed in Japanese Unexamined Patent Publication (Translation of PCT application) No. 2006-523001.
Figure 4:
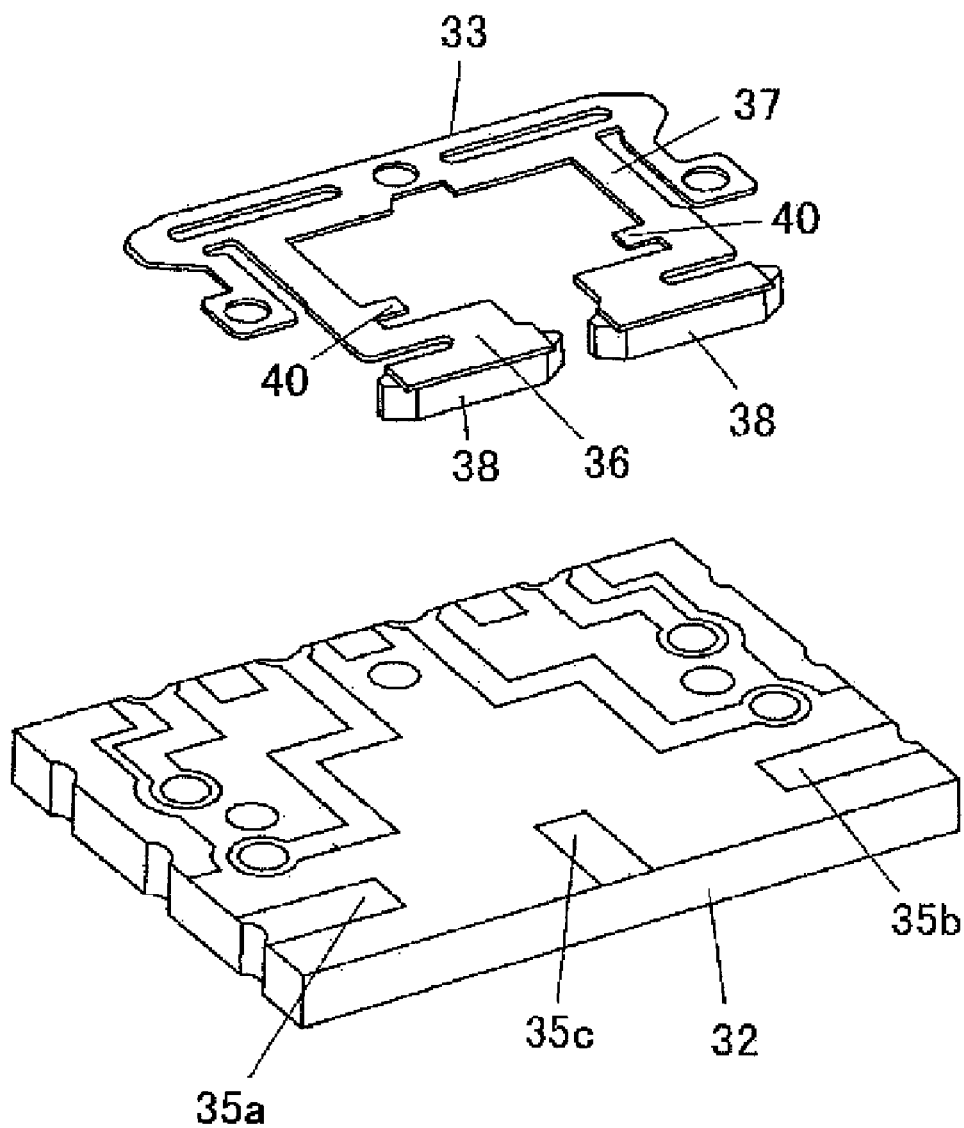
FIG. 4 is a perspective view illustrating a printed circuit card and a contact element supporting body used for the electromagnetic relay.
Figure 5A:
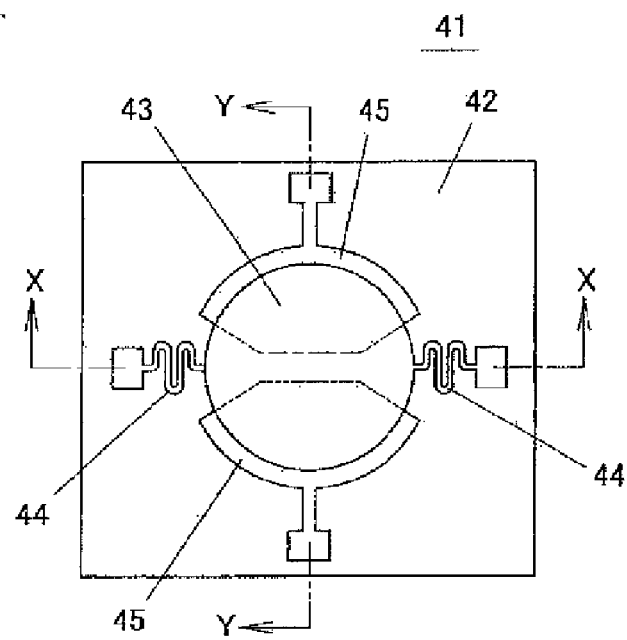
FIGS. 5A, 5B, and 5C are respectively a plan view illustrating the mirror device of a conventional example, a cross-sectional view taken along a line X-X in FIG. 5A, and a cross-sectional view taken along a line Y-Y in FIG. 5A.
Figure 5B:
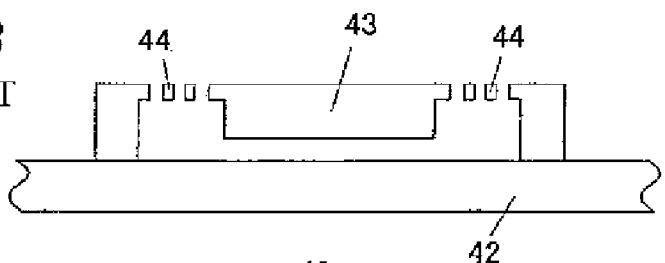
Figure 5C:
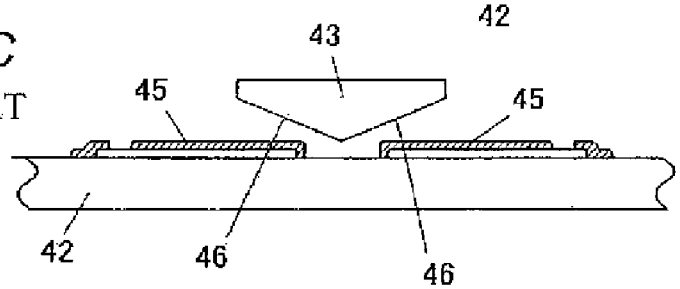
Figure 6:
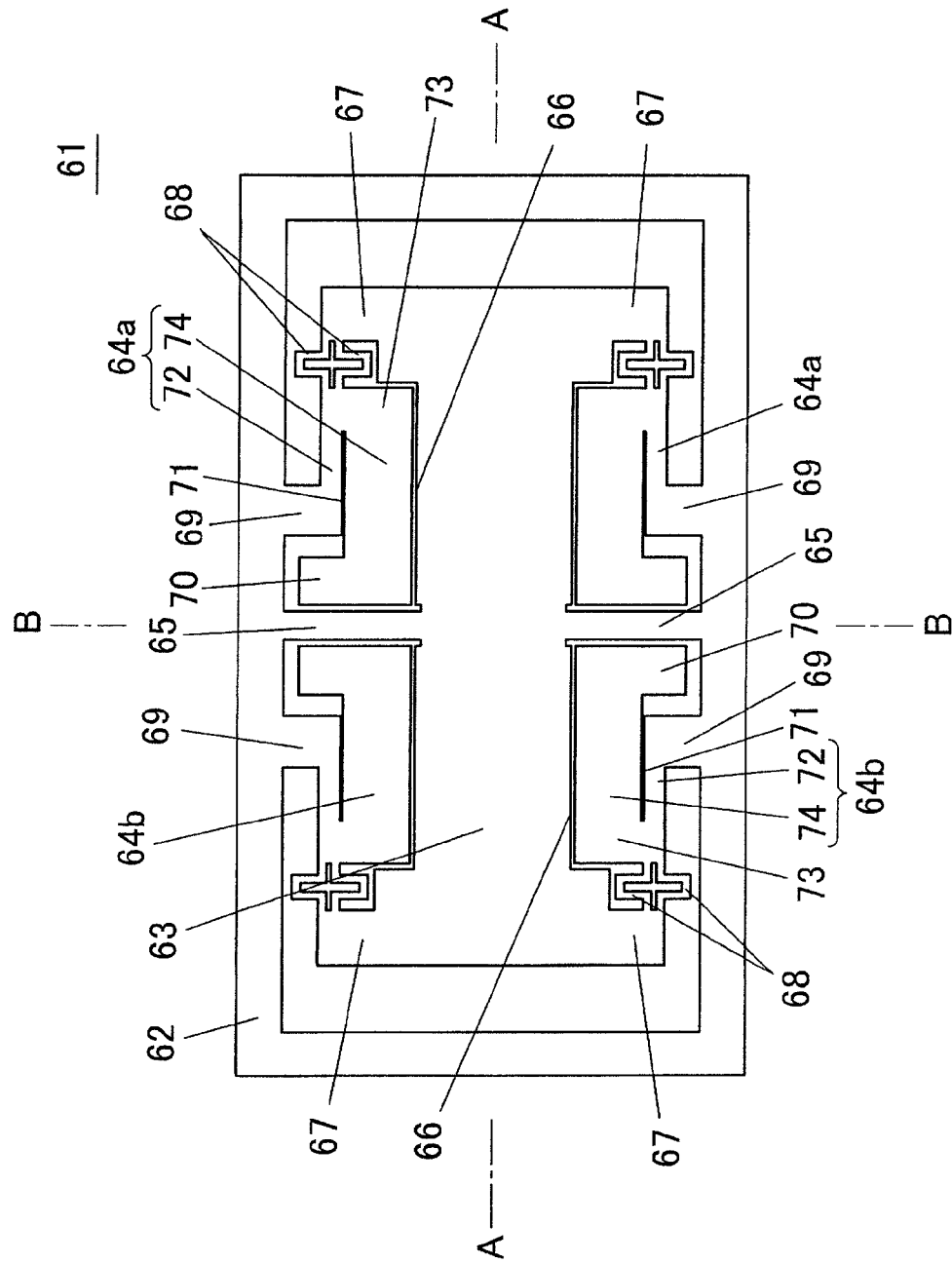
FIG. 6 is a plan view illustrating a spring according to a first embodiment of the present invention.

The following describes a structure of a spring according to a first embodiment of the present invention with reference to FIG. 6. A spring 61 is a minute MEMS spring that is integrally manufactured from a semiconductor substrate (wafer) such as Si utilizing an MEMS technique, and mainly used for an actuator such as a relay or a mirror device.

The spring 61 is manufactured by removing an unnecessary portion from the semiconductor substrate such as Si by etching and further thinning a semiconductor substrate by etching as needed, and has a substantially even thickness as a whole.

[Structure of Spring]

The spring 61 is mainly configured by a frame 62 (supporting member), an actuating member 63, and interlocking members 64a and 64b. The actuating member 63 is formed substantially in a rectangular plate shape, and rotatably supported near a center by two first supporting axes 65 linearly provided on right and left. Each supporting axis 65 is formed in a rectangle that is long in a right and left direction, and the other end of the axis is coupled to an inner circumferential portion of the frame 62. The actuating member 63 rotates in seesaw relation by elastically twisting and deforming the supporting axis 65, thereby causing both end portions of the actuating member 63 to move in a up and down direction. It should be noted that a thickness direction of the spring 61 is referred to as the up and down direction, and a direction that is perpendicular to a longitudinal direction of the actuating member 63 and the thickness direction of the spring 61 is referred to as the right and left direction.

On each side of the supporting axis 65, the interlocking members 64a and 64b are disposed on a right and a left side of the actuating member 63. The actuating member 63 and the interlocking members 64a and 64b are separated by thin slits 66, and the interlocking members 64a and 64b are coupled to the actuating member 63 via the coupling axes 67. The coupling axes 67 are respectively projecting from both side surfaces of both end portions of the actuating member 63. On the both side surfaces of the actuating member 63, end portions of the interlocking members 64a and 64b disposed in parallel with the actuating member 63 are connected to the coupling axes 67, and rotatably supported by second supporting axes 69 having rectangular side portions to the frame 62. The supporting axes 69 extend in parallel to the supporting axes 65. Further, two elastic extending and contracting portions 68 are provided in a zig-zag manner for end portions of the interlocking members 64a and 64b at portions closer to the coupling axes 67, and the elastic extending and contracting portions 68 are formed so as to be bilaterally line-symmetric to each other. Here, the interlocking members 64a and 64b are supported by the supporting axes 69 to the frame 62 at portions closer to the supporting axes 65 than to portions coupled to the actuating member 63 (the coupling axes 67), and point-of-action portions 70 are provided at portions closer to the supporting axis 65 than to the supporting axis 69 (end portions of the interlocking members 64a and 64b). Along with rotation of the actuating member 63, the interlocking members 64a and 64b rotate in seesaw relation by causing the supporting axis 69 to be elastically deformed and twisted, and the point-of-action portions 70 are displaced in the up and down direction. Further, the elastic extending and contracting portions 68 are deformed and flexed in addition to expansion and contraction.

Each of the interlocking members 64a and 64b are further separated into two sections by thin slits 71. The one section configures an interlocking member main body 72 including the elastic extending and contracting portion 68, and one end thereof is coupled to the coupling axis 67 and the other end thereof is rotatably supported by the supporting axis 69 to the frame 62. The other section configures a point-of-action spring portion 74. One end of the point-of-action spring portion 74 is coupled to a portion of the interlocking member main body 72 by a coupling axis 73 that parallely extends along the supporting axis 65, and the other end of the point-of-action spring portion 74 is provided with the point-of-action portion 70.

[Action of Spring]

Figure 7A:
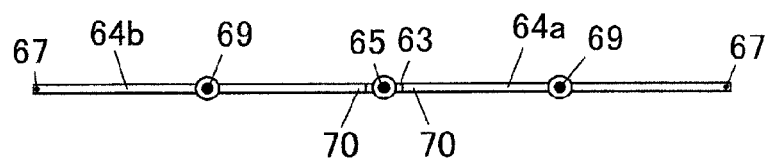
FIGS. 7A, 7B, and 7C are illustrative diagrams of an action of the spring.
Figure 7B:
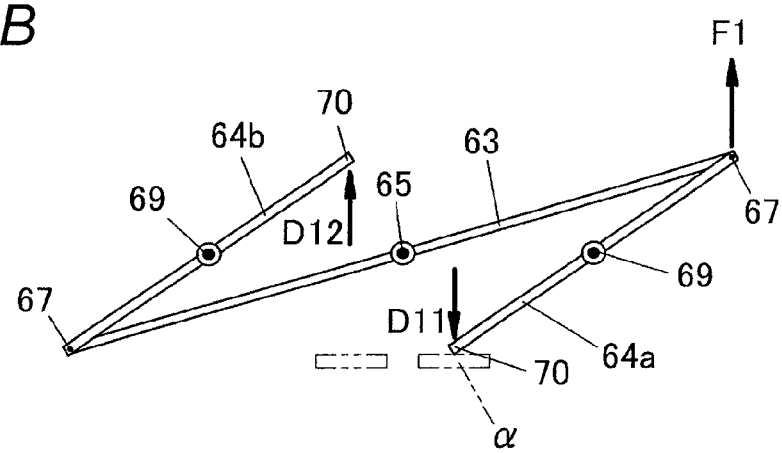
Figure 7C:
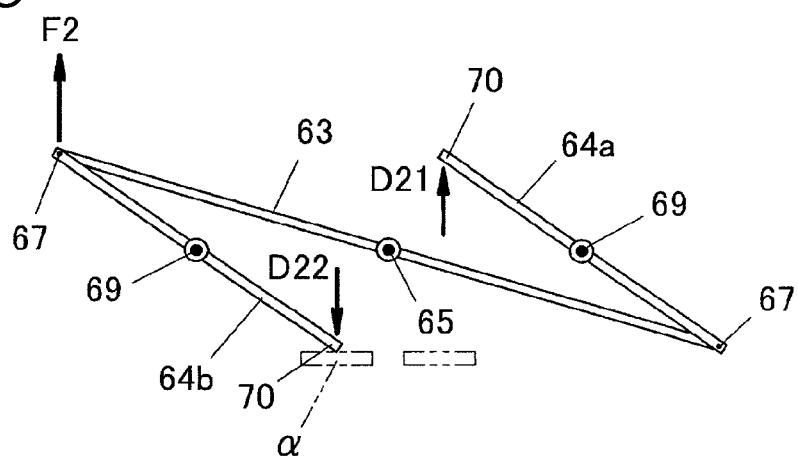

FIGS. 7A, 7B, and 7C are schematic side surface diagrams for illustration of an action of the spring 61. When an external force is not applied to the spring 61, as shown in FIG. 7A, the spring 61 is flat as a single flat plate.

When a force F1 is applied to the spring 61 such that the one end portion of the actuating member 63 (point of effort) is pulled upward (or when a force that pulls down the other end portion of the actuating member 63 is applied), as shown in FIG. 7B, the actuating member 63 is inclined and the one end portion is displaced upward, and the other end portion is displaced downward. Along with this displacement, the interlocking members 64a and 64b on the both sides are inclined toward the same direction, one of the point-of-action portions 70 that are positioned near the both sides of the supporting axis 65 is displaced downward as shown by D11, and the other is displaced upward as shown by D12. Accordingly, if there is an object α that is disposed near below the supporting axis 65, the point-of-action portion 70 that has moved downward is elastically brought into contact with the object α by elasticity of the point-of-action spring portion 74 and such.

Similarly, when a force F2 is applied such that the other end portion of the actuating member 63 (point of effort) is pulled upward (or, when a force that pulls down the one end portion of the actuating member 63), as shown in FIG. 7C, the actuating member 63 and the interlocking members 64a and 64b are respectively inverted, and the one point-of-action portion 70 is displaced upward as shown by D21, the other point-of-action portion 70 is displaced downward as shown by D22, and the point-of-action portion 70 that has been lowered is elastically brought into contact with the object α.

Alternatively, as shown in FIG. 7B and FIG. 7C, as a direction of inclination of the point-of-action portion 70 is inversed when the action state of the spring 61 is switched, it is possible to utilize the change in the inclination of each point-of-action portion 70 (refer to the mirror device described later).

[Characteristic of Spring]

The spring 61 according to this embodiment has the above structure and acts in the manner as described above, and is thus provided with characteristics as described below. As the spring 61 is provided with the interlocking members 64a and 64b on the both sides of the supporting axes 65 so as to fold back from the end portions of the actuating member 63, it is possible to move each of the point-of-action portions 70 up and down near the supporting axes 65. Accordingly, it is possible to shorten a distance between the point-of-action portions 70 disposed with the supporting axes 65 interposed therebetween, as well as a distance between the objects α.

Further, according to the spring 61, it is possible to move the interlocking members 64a and 64b directly by the force applied to the actuating member, the point-of-action portions 70 can be acted with a strong force, and therefore a failure in an action of the point-of-action portion 70 may not easily occur. Further, as the actuating member 63 and the interlocking members 64a and 64b are moved in seesaw relation to move the point-of-action portions 70, it is possible to produce a strong force in the point-of-action portions 70 based on the principle of leverage.

Further, as the spring 61 as a whole is formed integrally, and in particular, the actuating member 63 and the interlocking members 64a and 64b are integrally formed with the frame 62, it is not necessary to carry out positioning, adjustment, and assembly of the members of the spring 61 when manufacturing, and it is possible to manufacture the spring 61 easily or mount the spring 61 to devices easily. Furthermore, the actuating member 63 and the interlocking members 64a and 64b are coupled not only by the coupling axes 67 but also by the supporting axes 65, the frame 62, and the supporting axes 69, and therefore actional reliability of the actuating member 63 and the interlocking members 64a and 64b can be improved. Moreover, according to the spring 61, as shown in FIG. 6, as an axis A-A that passes a center of the actuating member 63 and an axis B-B that passes a center of the supporting axes 65 are provided in a symmetric structure (the frame 62 can be asymmetric), an action of each point-of-action portion 70 can be stabilized and a stroke of each point-of-action portion 70 and a force produced in each point-of-action portion 70 (a contact pressure to the object α) can be equalized.

Figure 8:
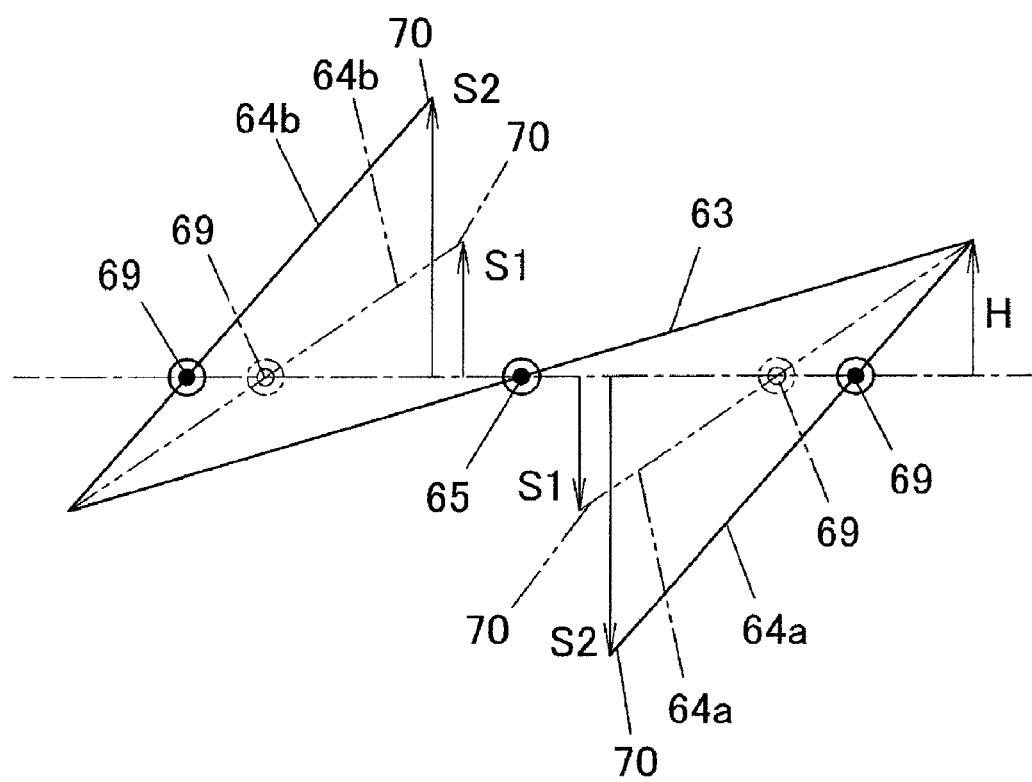
FIG. 8 is a diagram illustrating a relation between a position of a second supporting axis and a movement stroke of a point of action in the spring according to the first embodiment.

Further, as the spring 61 has the structure as described above, by changing positions at which the interlocking members 64a and 64b are connected to the actuating member 63 (positions of the coupling axes 73) and positions at which the interlocking members 64a and 64b are connected to the frame 62 (positions of the supporting axes 69), it is possible to freely design a movement stroke of each point-of-action portion 70 and a force produced in each point-of-action portion 70 without changing the actions of the actuating member 63 and the interlocking members 64a and 64b. In particular, the movement stroke of the point-of-action portions 70 can be equalized to a stroke of an end portion (point of effort) of the actuating member 63, or can be made larger or smaller than the stroke of the end portion of the actuating member 63. For example, FIG. 8 shows an example in which positions of the supporting axes 69 of the interlocking members 64a and 64b are moved to positions that are away from the supporting axes 65. Specifically, alternate long and two short dashes lines in FIG. 8 show the interlocking members 64a and 64b and the supporting axes 69 before moving, and solid lines show the interlocking members 64a and 64b and the supporting axes 69 after moving. In this manner, by positioning the supporting axes 69 away from the supporting axes 65, even if the movement stroke of the point-of-action portions 70 is the same as a stroke H of the end portion of the actuating member 63, the movement stroke of the point-of-action portions 70 can be increased from S1 before moving to S2 after moving. In contrast, when it is desired to reduce the movement stroke of the point-of-action portions 70, the supporting axes 69 can be positioned closer to the supporting axes 65. Further, moving the supporting axes 69 closer to the supporting axes 65 can increase the force produced in the point-of-action portions 70, and moving the supporting axes 69 away from the supporting axes 65 can reduce the force produced in the point-of-action portions 70.

Figure 9:
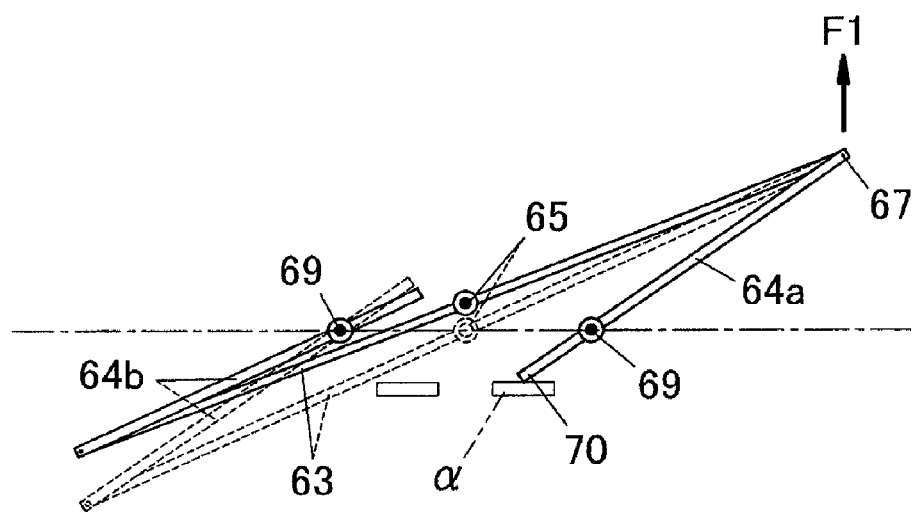
FIG. 9 is a diagram illustrating an effect of an uplift of an actuating member due to deformation of a first supporting axis.

Further, as the supporting axes 65 are thin and long, when the force F1 is applied to and lifts the one end portion of the actuating member 63, for example, the end portion on a side of the interlocking member 64a, as shown in FIG. 9, there is a case in which the supporting axes 65 are flexed upward and the actuating member 63 is lifted. Along with this uplift, an angle of the interlocking member 64b also changes, and the movement stroke of the point-of-action portions 70 of the interlocking member 64b is reduced. However, as the movement stroke of the point-of-action portions 70 of the interlocking member 64a is determined by a length of an arm of the interlocking member 64a that is pivotally supported by the supporting axis 69, the movement stroke of the point-of-action portions 70 of the interlocking member 64a does not change even if the actuating member 63 is lifted. Therefore, as the point-of-action portions 70 can be brought into contact with the object α without fail by positioning the object α under each of the point-of-action portions 70, when the spring 61 is caused to actuate by pulling (or pressing) up the end portion of the actuating member 63, it is desirable to provide the object α under the point-of-action portions 70. It should be noted that, due to the similar reason, it is desirable to position the object α above the point-of-action portions 70 when the spring 61 is caused to actuate by pulling (or pressing) down the end portion of the actuating member 63.

Figure 10:
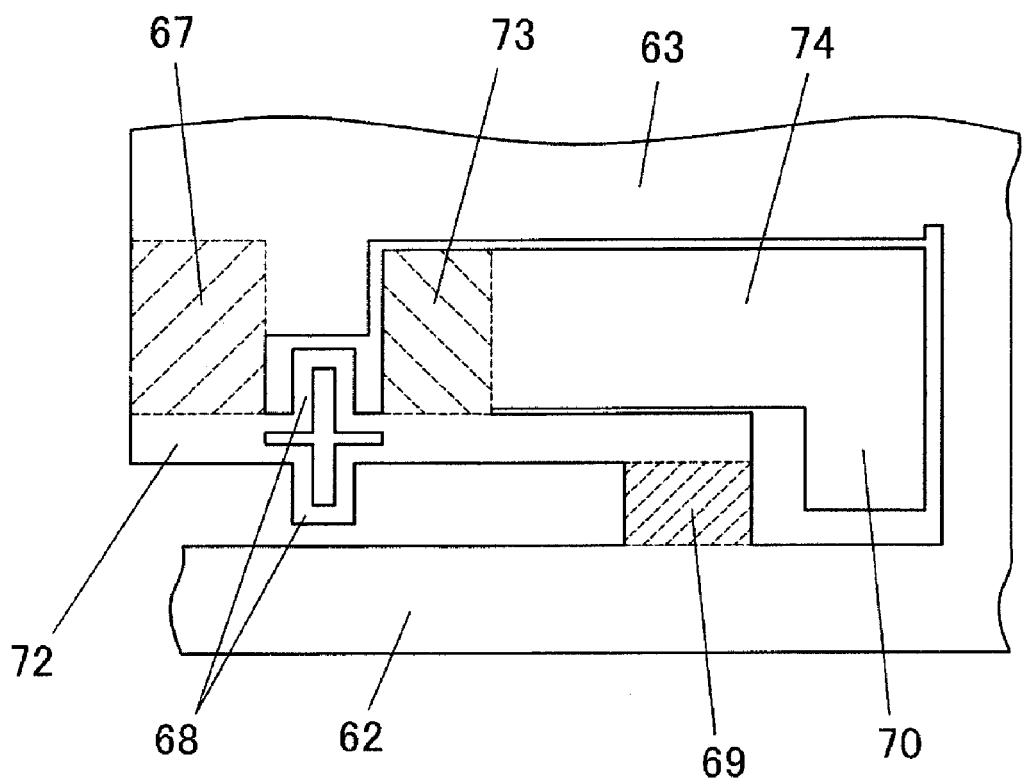
FIG. 10 is an enlarged plan view illustrating a shape of a main body of an interlocking member of the spring according to the first embodiment.

Next, a function of the elastic extending and contracting portion 68 provided for the interlocking member main body 72 is described. In FIG. 10, the interlocking member 64*a* or 64*b* is shown enlarged, and areas corresponding to the coupling axis 67, the supporting axis 69, and the coupling axis 73 are shown hatched. As shown in FIG. 10, the interlocking member main body 72 is formed in a strip shape, its both end portions are respectively held by the coupling axis 67 and the supporting axis 69, and holds the point-of-action spring portion 74 with the coupling axis 73 therebetween. The two meandering elastic extending and contracting portions 68 are disposed in a bilateral symmetric fashion, and provided between a portion supported by the coupling axis 67 of the interlocking member main body 72 and a portion holding the coupling axis 73. The elastic extending and contracting portion 68 can be provided between a portion holding the coupling axis 73 of the interlocking member main body 72 and a portion supported by the supporting axis 69.

Figure 11:
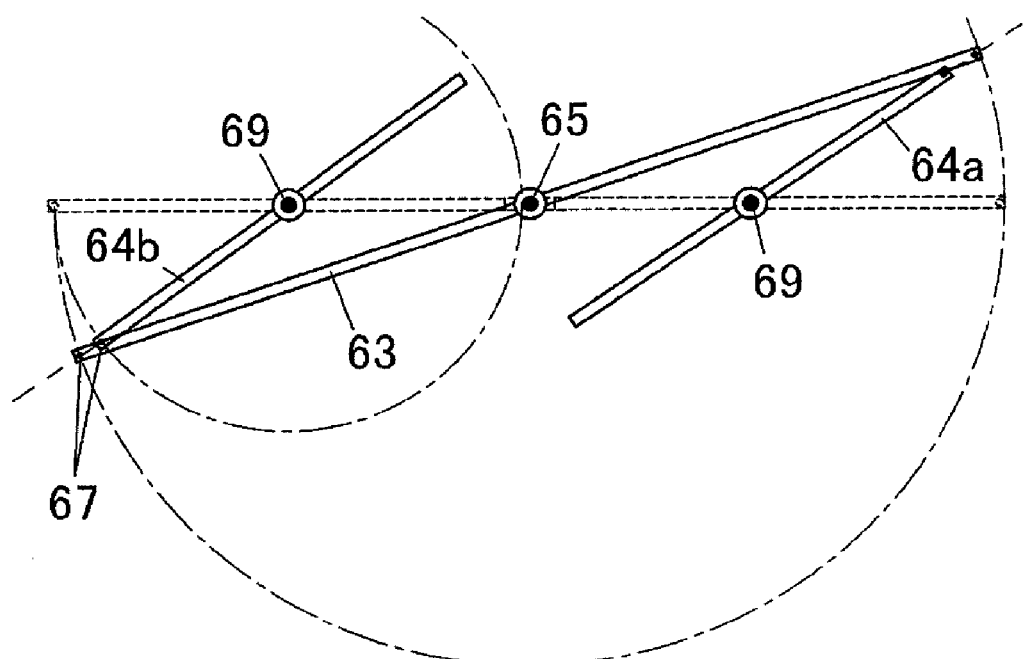
FIG. 11 is a diagram illustrating a working of an elastic extending and contracting portion.

As shown in FIG. 11, the length of the arm from the supporting axes 65 of the actuating member 63 to the coupling axes 67, and the length of the arm from the supporting axes 69 of the interlocking members 64*a* and 64*b* to the coupling axes 67 are different. Therefore, when rigidity of the actuating member 63 and the interlocking members 64*a* and 64*b* is high, the actuating member 63 cannot be rotated without the elastic extending and contracting portion 68. Further, if the actuating member 63 and the interlocking members 64*a* and 64*b* are elastic, when rotating the actuating member 63 and such, a stress is applied to the actuating member 63 in a compressing direction, a stress is applied to the interlocking members 64*a* and 64*b* in a tensile direction, and there is a possibility that the actuating member 63 and the coupling axes 67 are deformed or damaged without the elastic extending and contracting portion 68. Thus, the elastic extending and contracting portion 68 is provided for the interlocking member main body 72 to relax the stress and to facilitate rotation of the actuating member 63, thereby preventing the coupling axes 67 and such from being damaged. Further, providing the elastic extending and contracting portion 68 in the bilateral symmetric fashion prevents the elastic extending and contracting portion 68 and the interlocking member main body 72 from being twisted and deformed.

Figure 12:
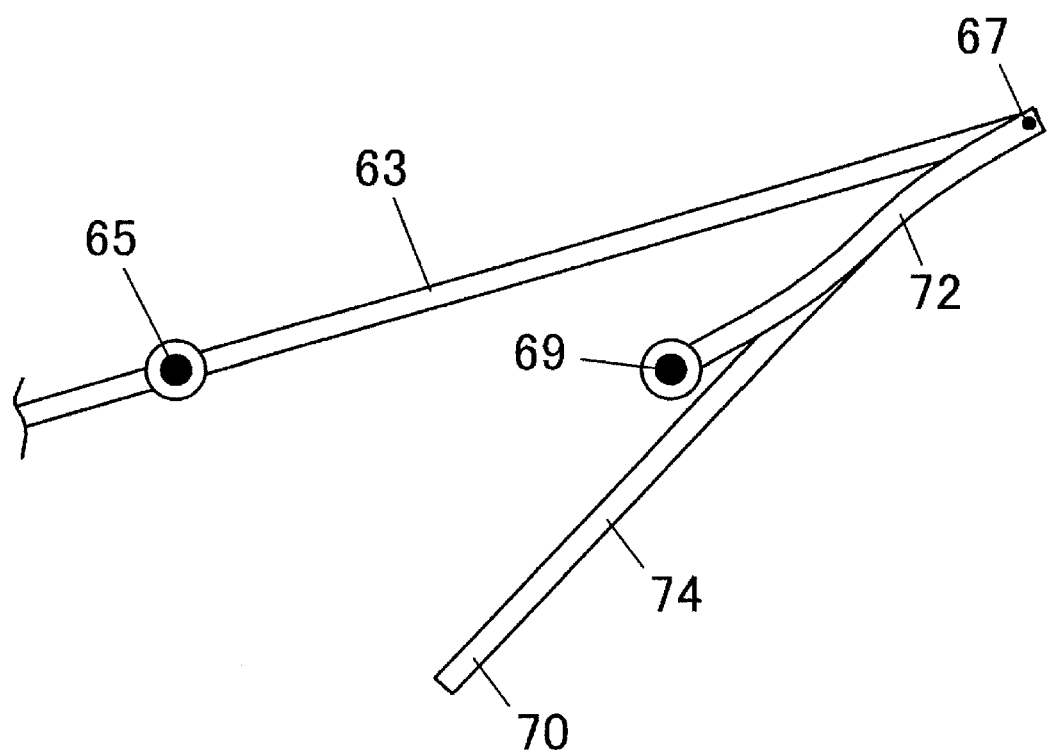
FIG. 12 is a diagram illustrating a reason why the interlocking member is split into the interlocking member main body and a point-of-action spring portion.

Next, the reason why the interlocking members 64*a* and 64*b* are divided into the interlocking member main body 72 and the point-of-action spring portion 74 is described. As the coupling axes 67 and the supporting axes 69 are twisted and deformed when applying a force to the actuating member 63 so as to incline in seesaw relation, the interlocking member main body 72 is flexed in a S shape by an elastic restoring force of the coupling axes 67 and the supporting axes 69, as shown in FIG. 12. Accordingly, the point-of-action spring portions 74 coupled to the interlocking member main body 72 via the coupling axes 73 are inclined by a larger inclination than that of the interlocking member main body 72. As a result, the movement stroke of the point-of-action portions 70 can be increased. As the movement stroke of the point-of-action portions 70 can be smaller by contrast depending on the positions of the coupling axes 73 on the interlocking member main body 72, the coupling axes 73 are fixed at the positions at which the movement stroke of the point-of-action portions 70 becomes larger.

(Variation of First Embodiment)

Figure 13:
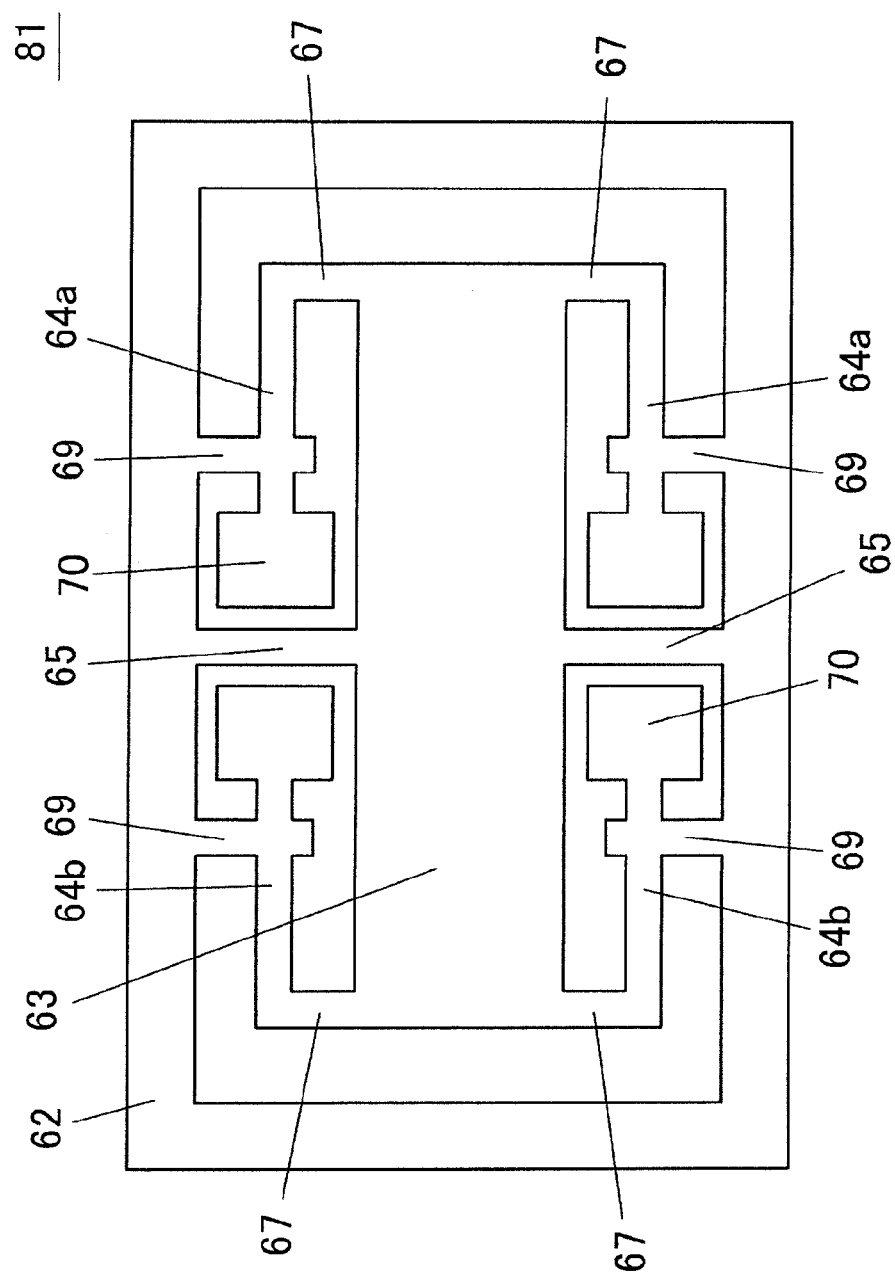
FIG. 13 is a plan view illustrating the spring according to a variation of the first embodiment.

FIG. 13 is a plan view illustrating a spring 81 according to a variation of the first embodiment. According to the spring 61 of the first embodiment, the interlocking members 64*a* and 64*b* are divided into the interlocking member main body 72 and the point-of-action spring portion 74, and have a structure that the interlocking member main body 72 and the point-of-action spring portion 74 are connected by the coupling axis 73. However, the spring 81 of this variation has a simple shape without dividing the interlocking members 64*a* and 64*b*. Therefore, this variation facilitates manufacturing and designing.

(Second Embodiment)

Figure 14:
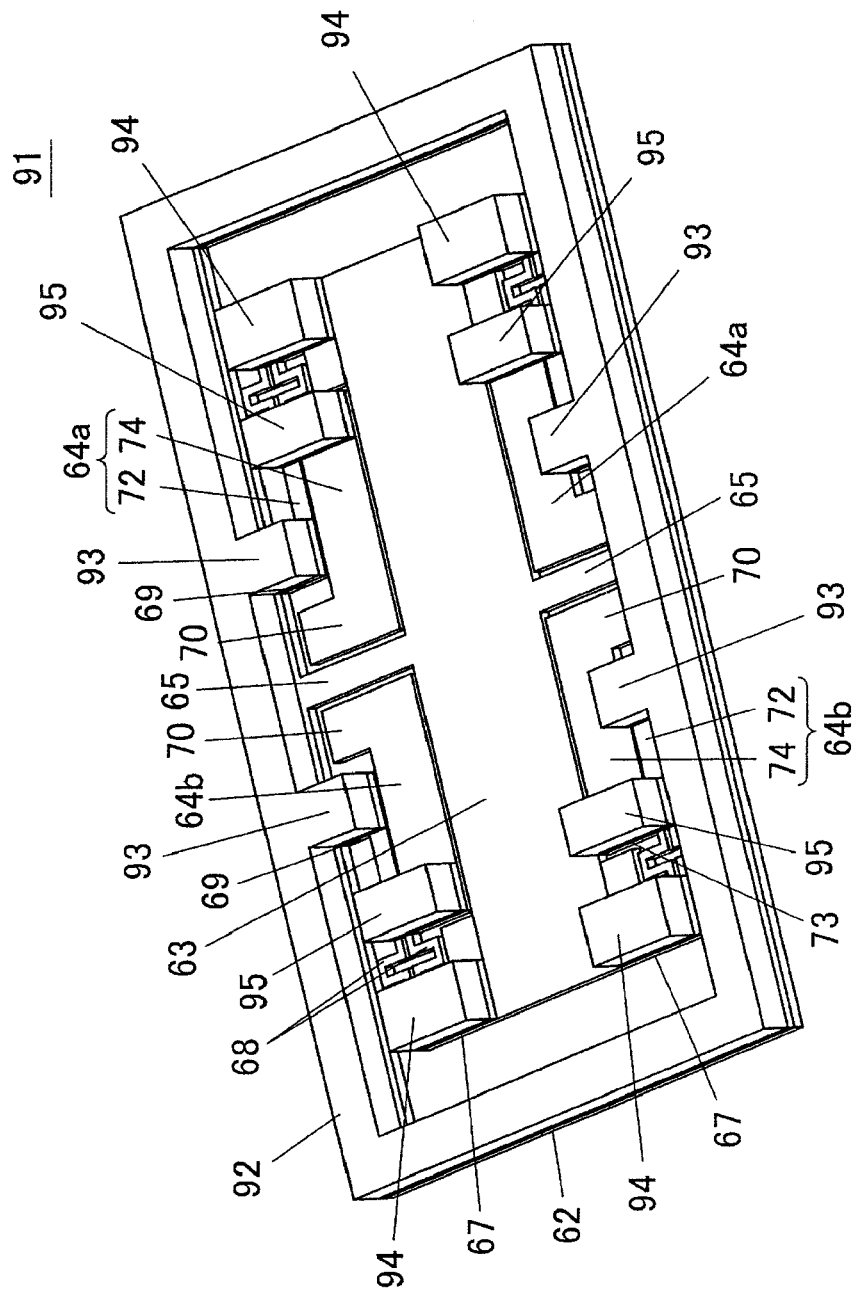
FIG. 14 is a perspective view illustrating the spring according to a second embodiment of the present invention.

FIG. 14 is a perspective view illustrating a structure of a spring 91 according to a second embodiment of the present invention. The spring 91 has, when viewed from a lower surface, the same shape as the spring 61 of the first embodiment. However, the spring 91 has a characteristic in that a thickness at a connecting portion in a direction parallel to the supporting axes 65 is made thicker. Specifically, in the spring 91, a reinforcement portion 92 is formed on the frame 62 to increase the thickness of a frame portion. Further, reinforcement portions 93 are formed on upper surfaces of areas extending from the supporting axes 69 to the interlocking member main body 72 to increase the thickness of a supporting axis portion. Moreover, reinforcement portions 94 are formed on upper surfaces of areas extending from the coupling axes 67 to the interlocking member main body 72 to increase the thickness of the supporting axis portion. Also, reinforcement portions 95 are formed on upper surfaces of areas extending from the coupling axes 73 to the interlocking member main body 72 to increase the thickness of a coupling axis portion.

Figure 15:
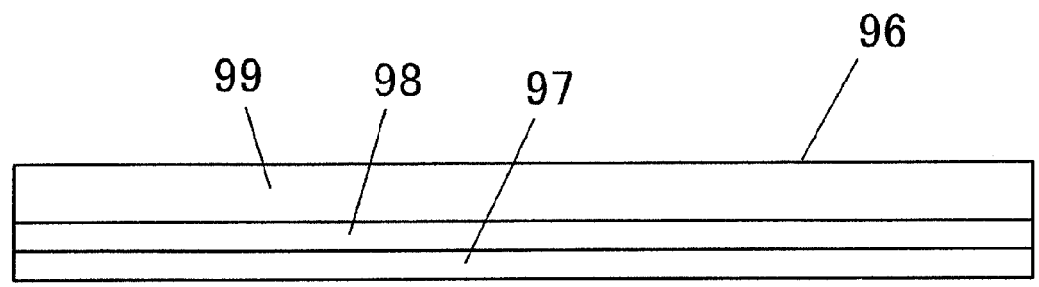
FIG. 15 is a schematic cross-sectional view illustrating an SOI substrate used for manufacturing the spring according to the second embodiment.

The spring 91 is manufactured using a SOI (Silicon on Insulator) substrate 96 as shown in FIG. 15. The SOI substrate 96 is a substrate configured by joining a device layer 97 as a Si layer and a handle layer 99 as a Si layer through a joining layer 98 made of $SiO_2$. The portions on which reinforcement portions 92-95 are provided are formed by an entire thickness of the SOI substrate 96, and the rest of the part is formed only by the device layer 97 by removing the handle layer 99 and the joining layer 98 by etching.

In order to couple the interlocking members 64*a* and 64*b* on the both sides of the one actuating member 63, the coupling axes 67 is required to be formed in a cantilever structure. However, with the coupling axes 67 of the cantilever structure, the action of the spring can be unstable by the coupling axes 67 being flexed and the interlocking members 64*a* and 64*b* being twisted when actuated. This also applies to the supporting axes 69 of the cantilever structure that supports the interlocking member main body 72, and to the coupling axes 73 of the cantilever structure that supports the point-of-action spring portion 74, and the interlocking member main body 72 and the point-of-action spring portion 74 can be twisted by the supporting axes 69 and the coupling axes 73 flexed. In order to prevent the twists from being occurred, the spring can be manufactured using a thick substrate. However, using a thick substrate increases a spring constant at each portion of the spring, thereby decreasing a degree of freedom in designing the spring such as the interlocking members 64*a* and 64*b*.

Therefore, according to the spring 91, thicker portions and less thick portions are provided mixedly, and the thickness is made greater at a portion where the larger spring constant (rigidity) is required, and the thickness is made smaller at a portion where the smaller spring constant (springiness) is required. In particular, the flexure of axis portions are reduced and the twist of the interlocking members 64*a* and 64*b* are reduced, by increasing the thickness of the axis portions that are in parallel to the supporting axes 65, and it is possible to freely design the spring constant as well as to stabilize the action of the spring 91.

Further, by using the SOI substrate 96 as described above and by making the thickness partially thin by the MEMS technique, it is possible to facilitate manufacturing of the structure like the spring 91.

(Variation of Second Embodiment)

Figure 16:
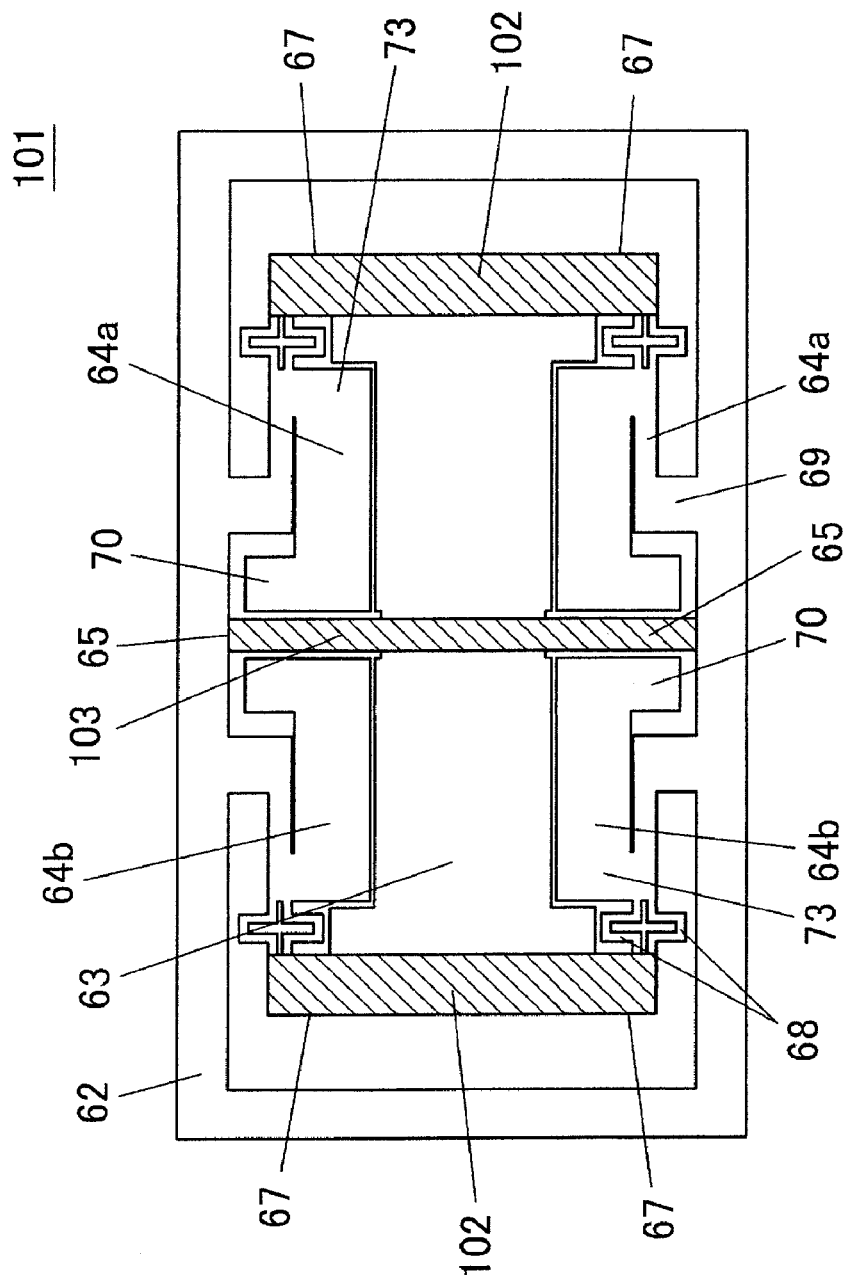
FIG. 16 is a plan view illustrating the spring according to a variation of the second embodiment.

FIG. 16 is a plan view illustrating a variation of the second embodiment. According to a spring 101 of this variation, an area shown by hatching in FIG. 16 is made thicker. Specifically, portions from end to end of the coupling axes 67 that are lined up linearly from right to left are configured as reinforcement portions 102 and the thickness of the portions is made thicker. Further, a portion from end to end of the supporting axes 65 that are lined up linearly from right to left are configured as a reinforcement portion 103 and the thickness of the portion is made thicker. In particular, in the reinforcement portion 103, an aspect ratio of the cross section of the reinforcement portion 103 in a direction perpendicular to a longitudinal direction is made 1.5 or more.

According to this variation, as the coupling axes 67 that are lined up from right to left are connected via the rigid reinforcement portions 102, a difference of the twist between the interlocking members 64a and 64b on the right and left can be reduced, the action can be stabilized, and reliability of the action at the point-of-action portions 70 can be improved.

Further, as the supporting axes 65 that are lined up from right to left are connected via the rigid reinforcement portions 103, the supporting axes 65 are hard to be flexed. As a result, the supporting axes 65 only deform in the twisting direction, and displacement of the actuating member 63 in the action in the up and down direction can be prevented (see FIG. 9).

(Third Embodiment)

Figure 17:
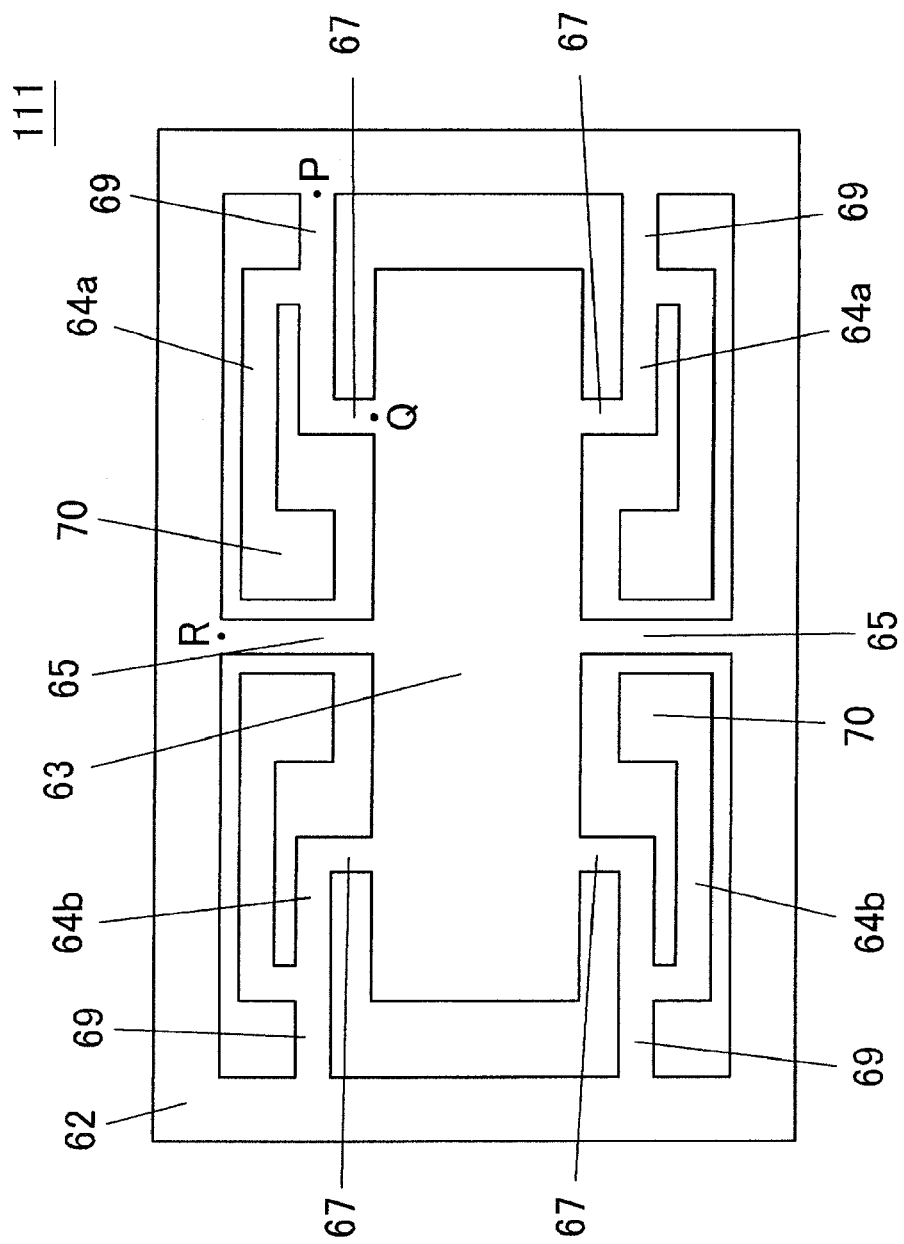
FIG. 17 is a plan view illustrating the spring according to a third embodiment of the present invention.

FIG. 17 is a plan view illustrating a structure of a spring 111 according to a third embodiment of the present invention. According to the spring 111, the coupling axes 67 are caused to extend from side surface of the end portion of the actuating member 63, base end portions of the interlocking members 64a and 64b in a flat plane shape that is flexed substantially in a U shape is coupled to the coupling axes 67, and the point-of-action portions 70 are determined to be at tip end portions of the interlocking members 64a and 64b, that is, portions closest to the supporting axes 65. Further, from portions most distant from the supporting axes 65 of the interlocking members 64a and 64b, the supporting axes 69 are caused to extend in distal direction from the supporting axes 65, and the supporting axes 69 are coupled to an inner circumferential portion of the frame 62. Accordingly, when observing the spring 111 from the side surface, the coupling axes 67 (a support point Q of the interlocking members 64a and 64b in the actuating member 63) are provided closer to the supporting axes 65 (a support point R of the actuating member 63 in the frame 62) than to the supporting axes 69 (a support point P of the interlocking members 64a and 64b in the frame 62), and the point-of-action portions 70 are provided so as to be closer to the supporting axes 65 than to the coupling axes 67.

Figure 18:
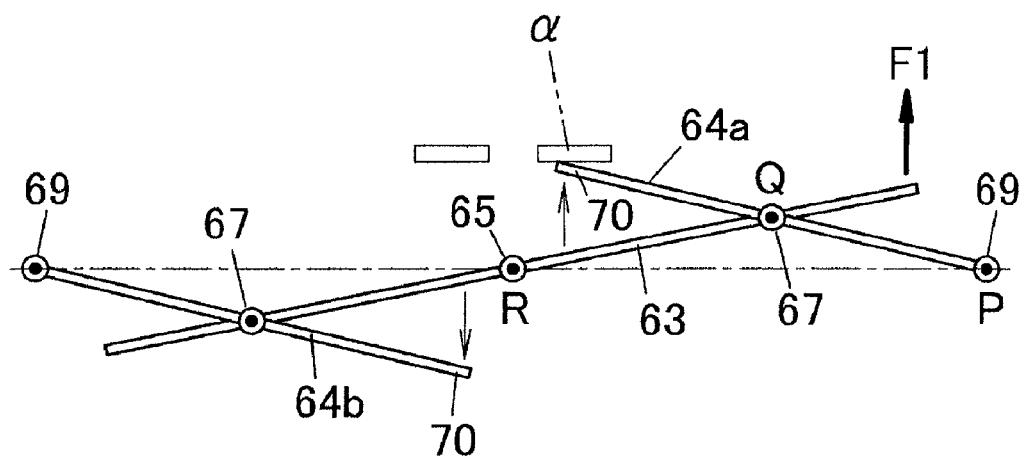
FIG. 18 is an illustrative diagram of an action of the spring.

According to the spring 111, when observing from the side surface, as the coupling axes 67 are positioned in the middle of the supporting axes 65 and the supporting axes 69, as shown in FIG. 18, when the force F1 is applied to lift the one end portion of the actuating member 63 (or when the force that pulls down the other end portion of the actuating member 63 is applied), the actuating member 63 is inclined and the one end portion is displaced upward, and the other end portion is displaced downward. Along with this displacement, the interlocking members 64a and 64b on the both sides are inclined to a direction opposite of the actuating member 63, and one of the point-of-action portions 70 positioned near the both sides of the supporting axes 65 is displaced upward, and the other of the point-of-action portions 70 is displaced downward. Accordingly, if there is an object α that is disposed near above the supporting axes 65, the point-of-action portion 70 that has moved upward is elastically brought into contact with the object α by elasticity of the point-of-action spring portion 74 and such. This also applies to a case where the force F2 is applied to lift the other end portion of the actuating member 63 (or when the force that pulls down the one end portion of the actuating member 63 is applied).

Further, also in the case of the spring 111, when a force is applied to and lifts the end portion of the actuating member 63, there is a case in which the supporting axes 65 are flexed upward and the actuating member 63 is lifted, thereby causing the variation in the inclination of the actuating member 63. Along with this uplift, the angle of the interlocking member 64a or 64b that is positioned on the side opposite of the side on which the force is applied changes, and the downward movement stroke of the point-of-action portion 70 of the interlocking member 64a or 64b becomes smaller (see FIG. 9). Therefore, according to the spring 111, when the end portion of the actuating member 63 is pulled up (or pressed up) to actuate the spring 61, it is desirable to provide the object α above the point-of-action portion 70. Further, when the end portion of the actuating member 63 is pulled down (or pressed down) to actuate the spring 61, it is desirable to provide the object α under the point-of-action portion 70.

(Variation of Third Embodiment)

Figure 19:
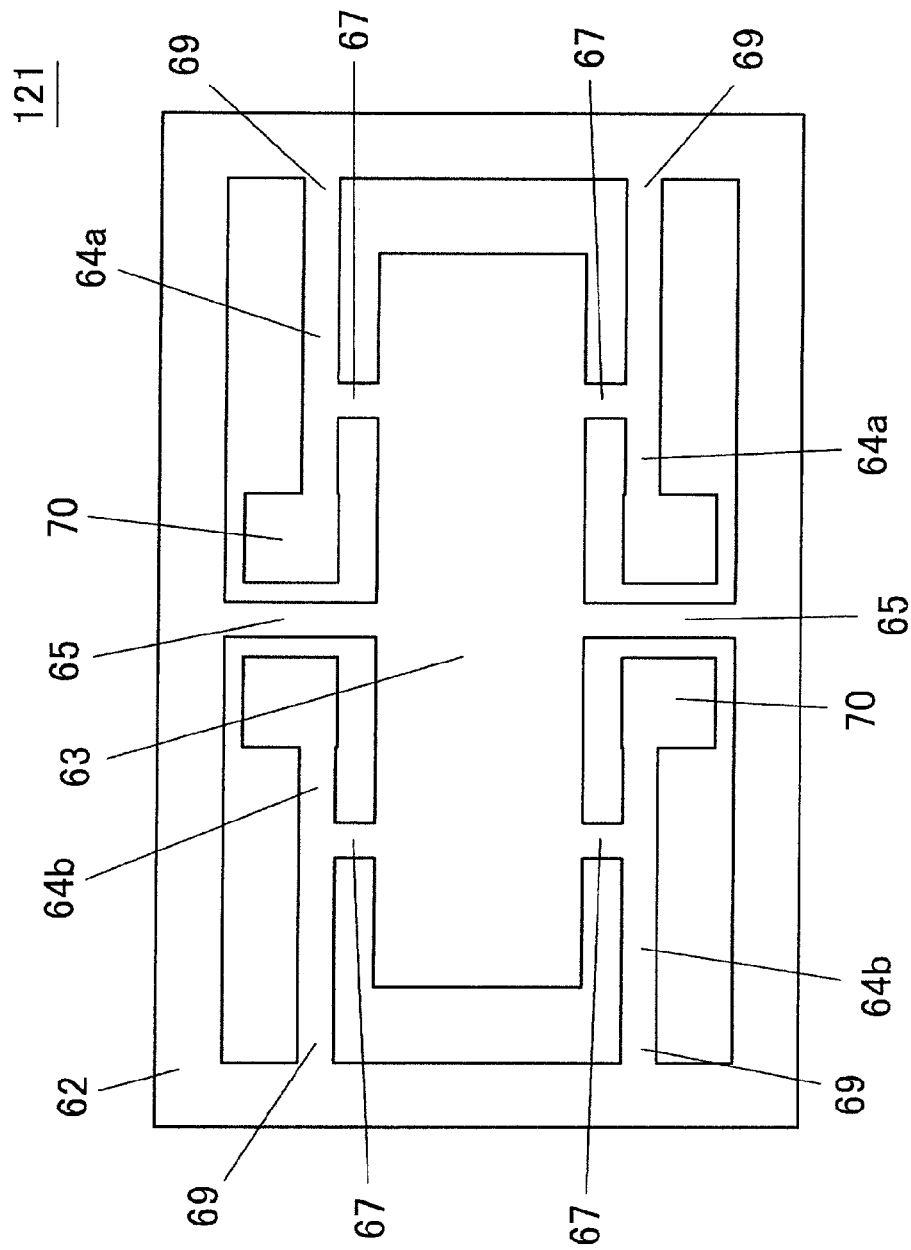
FIG. 19 is a plan view illustrating the spring according to a variation of the third embodiment.

FIG. 19 is a plan view illustrating a spring 121 according to a variation of the third embodiment. This 112 variation is such that the interlocking members 64a and 64b are formed in a straight shape instead of making flexed in the substantial U shape as in the third embodiment.

Figure 20:
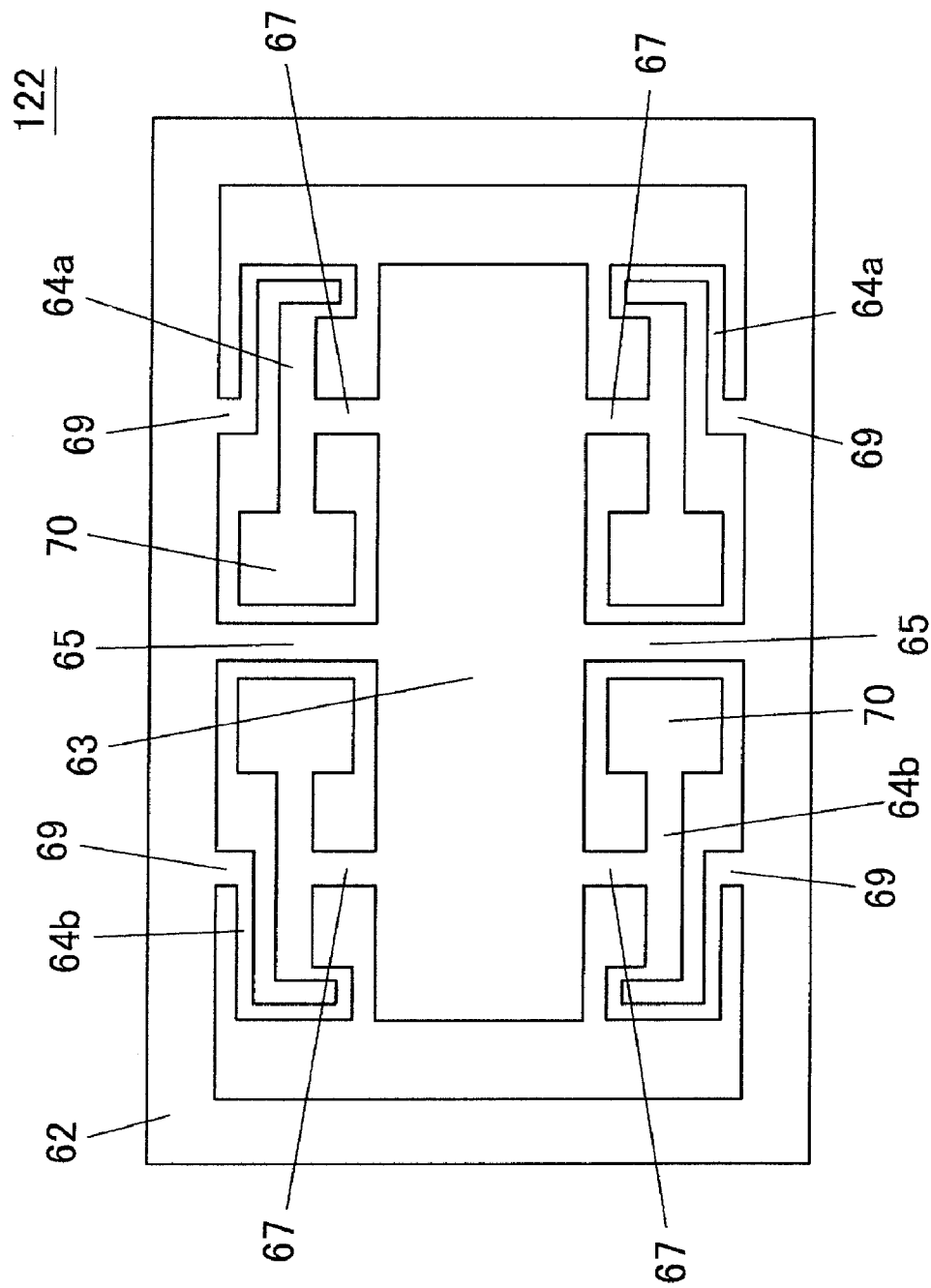
FIG. 20 is a plan view illustrating the spring according to another variation of the third embodiment.

FIG. 20 is a plan view illustrating a spring 122 according to another variation of the third embodiment. According to the spring 122, the supporting axes 69 and the coupling axes 67 are provided coaxially. Also in this case, when the actuating member 63 is rotated in seesaw relation, the interlocking members 64a and 64b are inclined to the direction opposite of the actuating member 63, as in the case of the spring 111 of the third embodiment.

(Fourth Embodiment)

Figure 21:
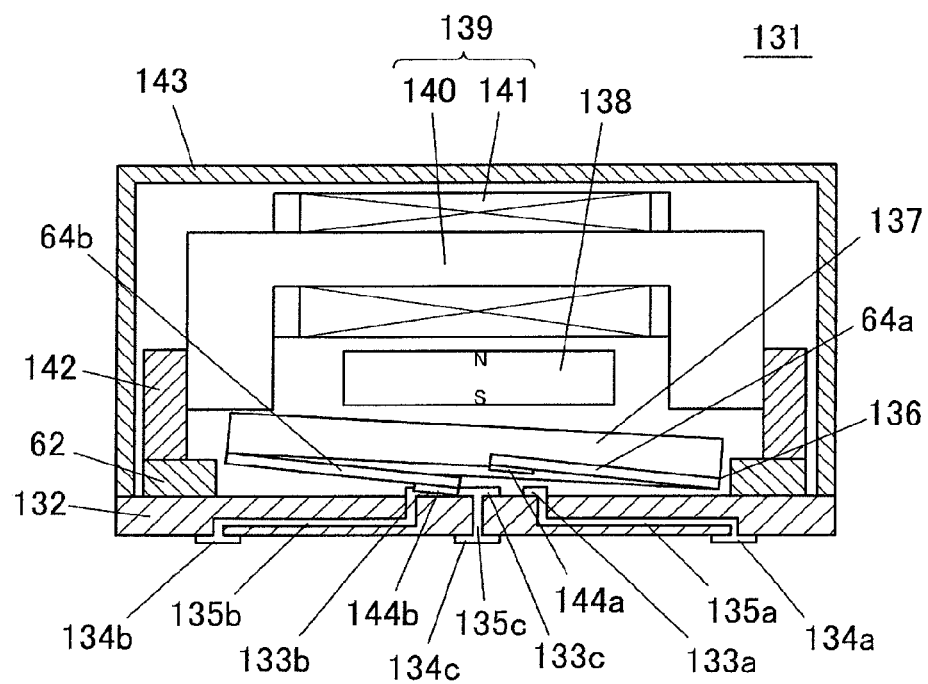
FIG. 21 is a cross-sectional view of a high frequency relay according to a fourth embodiment of the present invention.

FIG. 21 is a cross-sectional view illustrating a structure of a high frequency relay 131 according to a fourth embodiment of the present invention. The high frequency relay 131 is a relay for turning on and off a high-frequency signal of 10 GHz band.

The high frequency relay 131 is such that a spring 136 is provided over a base substrate 132, a magnet 139 is provide over the spring 136 to drive the spring 136, and then covered with a cover 143 substantially as a whole. The base substrate 132 is a ceramic substrate whose upper surface is provided with a fixed contact 133a (a contact), a fixed contact 133b (b contact), and a fixed contact 133c (c contact) on two sites, right and left, and is a 2c contact structure. Further, a lower surface of the base substrate 132 is provided with back electrodes 134a, 134b, and 134c, and the fixed contact 133a and the back electrode 134a are connected with an internal wiring 135a, the fixed contact 133b and the back electrode 134b are connected with an internal wiring 135b, and the fixed contact 133c and the back electrode 134c are connected with an internal wiring 135c.

The spring 136 is the spring according to one or more embodiments of the present invention, and can be the spring according to any of the embodiments described above, or can have a structure other than those described above. The spring 136 is provided on an upper surface of the base substrate 132 such that such as the actuating member 63 and the interlocking members 64a and 64b are lifted from the base substrate 132 by making the thickness of the frame 62 thicker on the side of the lower surface. A rectangular iron piece 137 (armature) is integrally applied over an entire upper surface of the actuating member 63. Further, a lower surface of the point-of-action portion 70 of the interlocking member 64a is provided with a moving contact 144a, and a lower surface of the point-of-action portion 70 of the interlocking member 64b is provided with a moving contact 144b.

A permanent magnet 138 and the magnet 139 provided above the spring 136 are supported by a spacer 142 provided on the upper surface of the frame 62. The spacer 142 is manufactured by a nonmagnetic material such as Si, glass, or nonmagnetic metal. The magnet 139 is configured such that a coil 141 is wound around a yoke 140, and both tip ends of the yoke 140 face upper surfaces of both end portions of the iron piece 137. Further, the permanent magnet 138 is provided such that its upper surface and lower surface are a north pole and a south pole, respectively. Accordingly, when the coil 141 is excited by permitting conduction, a magnetic flux density increases at one tip end portion of the yoke 140 and the magnetic flux density decreases at the other tip end portion, and therefore one end portion of the iron piece 137 is attracted to the yoke tip end having greater magnetic flux density, thereby the actuating member 63 inclining in seesaw relation. In this manner, when the end portion of the iron piece 137 is attracted to the yoke 140, a magnetic force of the permanent magnet 138 maintains the end portions of the iron piece 137 in contact with the tip ends of the yoke 140 (latched state) even after the current through the coil 141 is turned off, thereby maintaining the actuating member 63 in an activated state.

Further, when a conduction direction of the coil 141 is switched, the other end portion of the iron piece 137 is attracted to the other tip end of the yoke 140 and the actuating member 63 is inclined to the opposite direction, and the actuating member 63 maintains in the activated state even after the current through the coil 141 is turned off.

Figure 22:
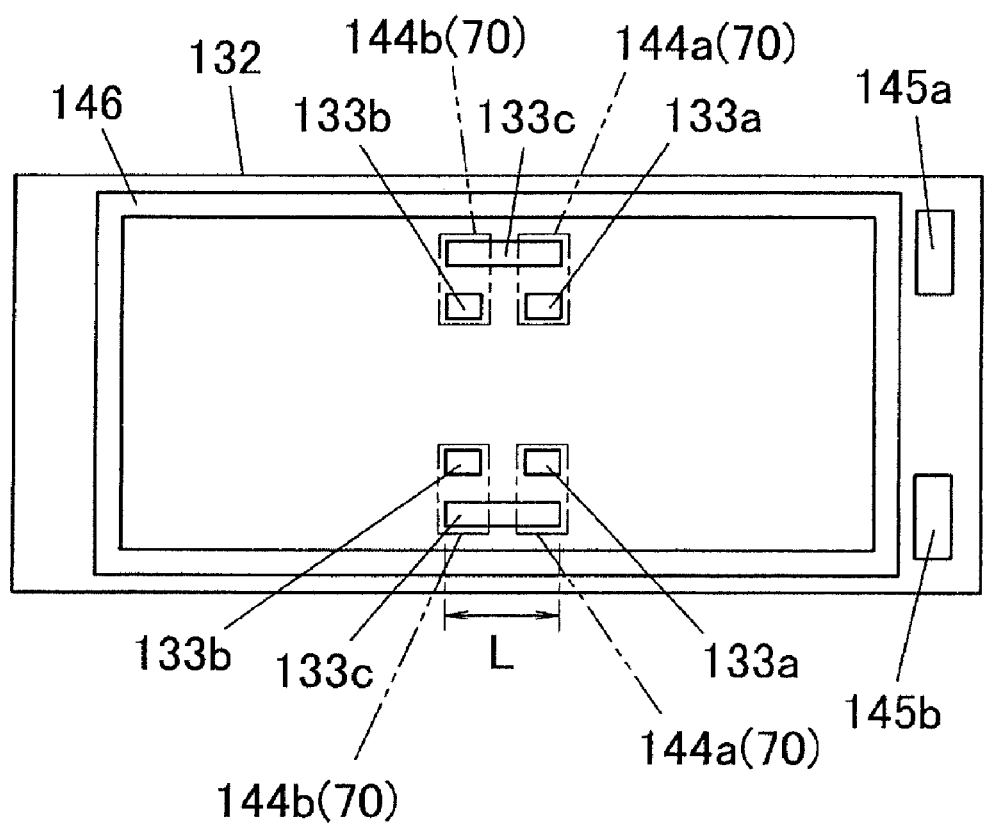
FIG. 22 is a plan view illustrating a base substrate provided for a substrate of the relay.

FIG. 22 illustrates an electrode pattern on the upper surface of the base substrate 132. The fixed contact 133c for grounding is twice as long as the fixed contacts 133a and 133b for signaling, and the fixed contacts 133a and 133b are respectively provided in parallel to both end portions of the fixed contact 133c. It is preferable that the moving contacts 144a and 144b and the fixed contacts 133a, 133b, and 133c are metal plated with an Au alloy such as AuCo, AuAg, and AuNi. Then, the moving contact 144a provided on the lower surface of the point-of-action portions 70 of the interlocking member 64a is disposed so as to cross over a half side of the fixed contact 133c and above the fixed contact 133a. Similarly, the moving contact 144b provided on the lower surface of the point-of-action portion 70 of the interlocking member 64b is disposed so as to cross over the other half of the fixed contact 133c and above the fixed contact 133b.

Thus, by switching the rotating direction of the iron piece 137 (the actuating member 63) depending on the conducting direction of the magnet 139, it is possible to switch between two states: an actuating state in which the moving contact 144a can be brought into contact with the fixed contacts 133a and 133c to close between the fixed contacts 133a and 133c and open between the fixed contacts 133b and 133c, and an actuating state in which the moving contact 144b can be brought into contact with the fixed contacts 133b and 133c to close between the fixed contacts 133b and 133c and open between the fixed contacts 133a and 133c.

It should be noted that a cover joining portion 146 as shown in FIG. 22 is an electrode pattern for soldering a lower surface of an outer circumference of the cover 143 to the base substrate 132. Further, a magnet driving contacts 145a and 145b are electrodes for allowing conduction through the magnet 139.

According to the high frequency relay 131 as described above, as the spring 136 according to one or more embodiments of the present invention in which the point-of-action portion 70 is provided with the moving contacts 144a and 144b is used, the fixed contact 133a and the fixed contact 133b can be disposed near each other and a length L of the fixed contact 133c can be reduced. Therefore, a high-frequency noise cannot be easily generated in the high frequency relay 131, thereby improving the high frequency characteristic of the high frequency relay 131.

Further, as the high frequency relay 131 uses the spring 136 according to one or more embodiments of the present invention, the moving contacts 144a and 144b can be brought into contact with the fixed contacts 133a, 133b, and 133c without fail. Moreover, as the interlocking members 64a and 64b are directly driven by the force attracting the iron piece 137 with the magnet 139 and the moving contacts 144a and 144b are dissociated from the fixed contacts 133a, 133b, and 133c by a strong force, it is possible to prevent a phenomenon in which the moving contacts 144a and 144b are fastened to the fixed contacts 133a, 133b, and 133c. Further, it is also possible to increase the length of the movement stroke of the moving contacts 144a and 144b by changing the positions of the supporting axes 69.

Further, as the permanent magnet 138 and the magnet 139 are used to drive the spring 136, a latching operation of the high frequency relay 131 is allowed.

(Fifth Embodiment)

Figure 23:
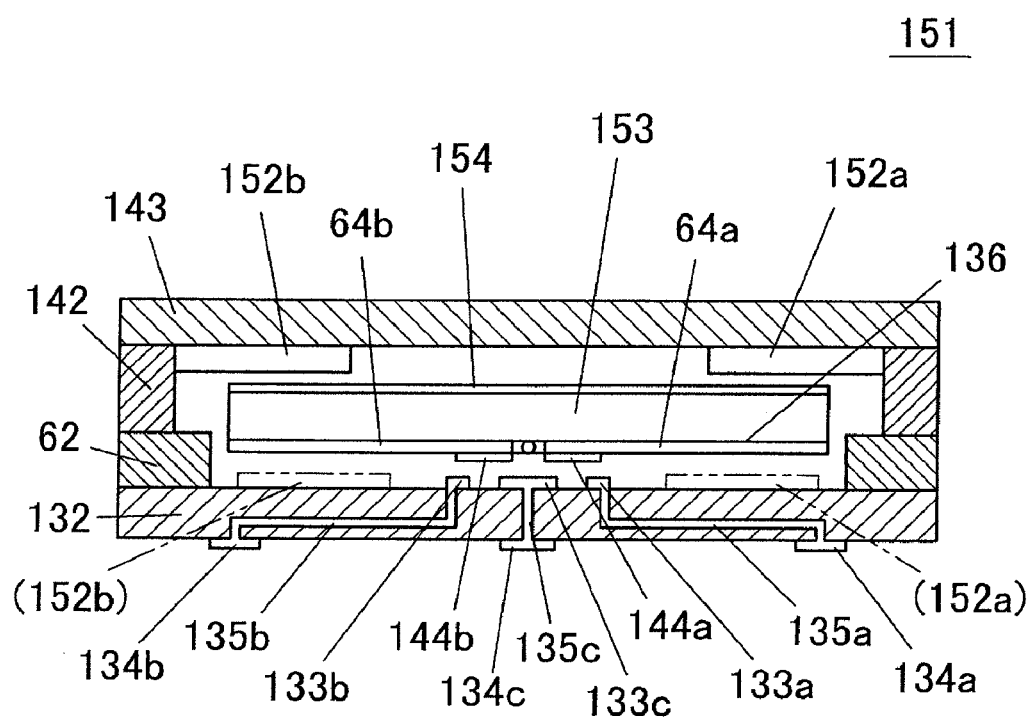
FIG. 23 is a cross-sectional view of a high frequency relay according to a fifth embodiment of the present invention.

FIG. 23 is a cross-sectional view illustrating a structure of a high frequency relay 151 according to a fifth embodiment of the present invention. According to the high frequency relay 151, the spring 136 is driven by an electrostatic attractive force between the electrodes. As components other than the driving unit are the same as the components in the fourth embodiment, only differing components from the fourth embodiment will be described. According to the high frequency relay 151, a movable electrode plate 153 made of a metal plate and such is integrally joined on an upper surface of the actuating member 63 of the spring 136, and further an upper surface of the movable electrode plate 153 is covered by an insulating film 154. Further, fixed electrodes 152a and 152b are provided on a lower surface of the cover 143 that covers upper side so as to face both end portions of the movable electrode plate 153. The movable electrode plate 153 is maintained at a ground potential. Accordingly, a high-frequency signal that flows through the high frequency relay 151 is shielded by the movable electrode plate 153.

According to the high frequency relay 151, when a potential difference is generated between one of the fixed electrode 152a and the fixed electrode 152b and the movable electrode plate 153, an end portion of the movable electrode plate 153 is attracted to the fixed electrode 152a or 152b, the spring 136 is driven to rotate the actuating member 63, and the fixed contacts 133a and 133c or fixed contacts 133b and 133c are switched.

It should be noted that the fixed electrodes 152a and 152b can be provided on an upper surface of the base substrate 132 as shown by alternate long and two short dashes lines in FIG. 23.

(Sixth Embodiment)

Figure 24:
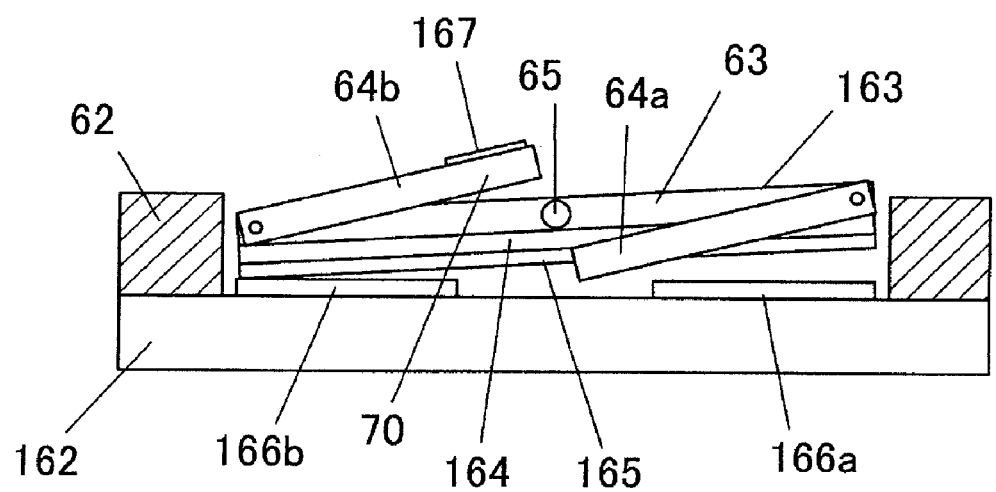
FIG. 24 is a cross-sectional view of a mirror device according to a sixth embodiment of the present invention.
Figure 25:
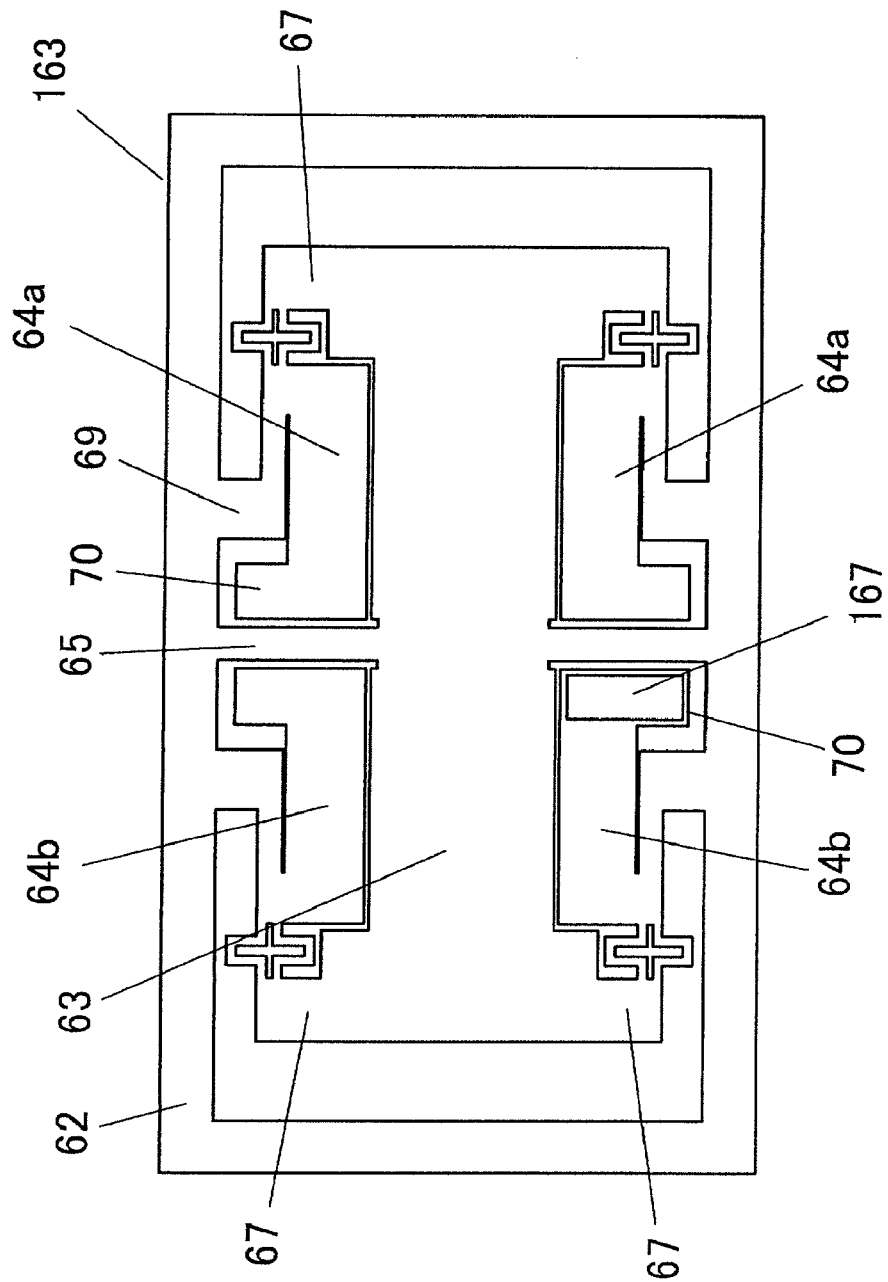
FIG. 25 is a plan view illustrating the spring used for the mirror device.

FIG. 24 is a cross-sectional view illustrating a structure of a mirror device 161 according to a sixth embodiment of the present invention. FIG. 25 is a plan view of a spring 163 that is used for the mirror device 161.

According to the mirror device 161, the spring 163 is overlapped on a base substrate 162, and a movable electrode plate 164 made of a metal plate and such is integrally joined on a lower surface of the actuating member 63, and further a lower surface of the movable electrode plate 164 is covered by an insulating film 165. Further, fixed electrodes 166a and 166b are provided on an upper surface of the base substrate 162 so as to face both end portions of the movable electrode plate 164. As shown in FIG. 25, a mirror 167 is provided on the upper surface of the point-of-action portion 70 of the spring 163. It is not necessary to provide the mirror 167 for all of the point-of-action portions 70, and the mirror 167 can be provided only for a single portion.

Figure 26A:
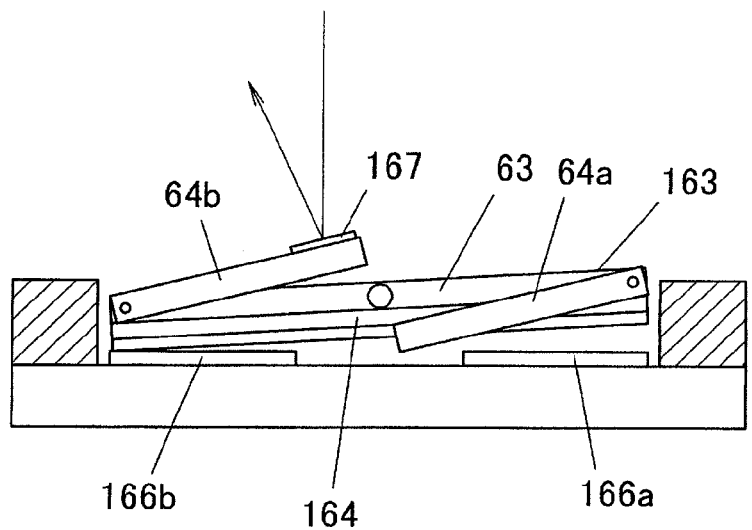
FIGS. 26A and 26B are illustrative diagrams of an action of the mirror device.
Figure 26B:
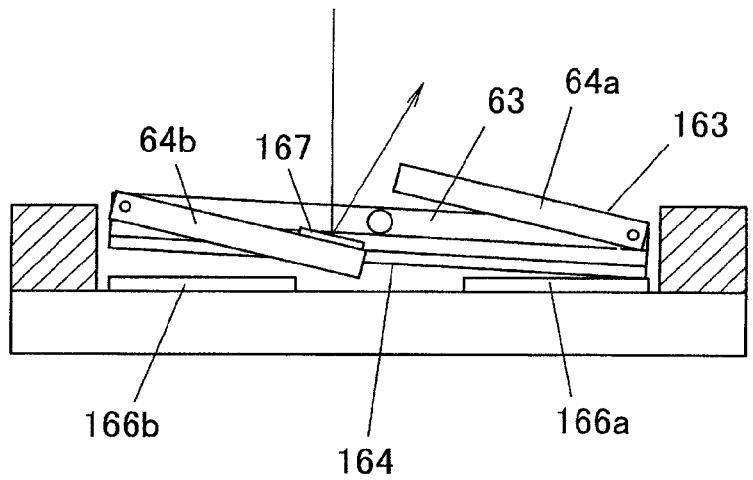

Further, according to the mirror device 161, as an inclination of the mirror 167 changes between a case in which attracting the movable electrode plate 164 by the fixed electrode 166b as shown in FIG. 26A and a case in which attracting the movable electrode plate 164 by the fixed electrode 166a as shown in FIG. 26B, it is possible to change a reflecting direction of light that incidents the mirror 167 as shown by arrows in FIGS. 26A and 26B. Further, as the inclination of the interlocking members 64a and 64b is greater than the inclination of the actuating member 63, it is possible to increase the change in an angle of the mirror 167, thereby increasing the change of the reflecting direction of the light.

Moreover, as the mirror device 161 uses the spring 163 according to one or more embodiments of the present invention, it is possible to change the angle of the interlocking members 64a and 64b, that is, the angle of the mirror 167 by changing the positions of the supporting axes 69 without changing the structure of the spring 163 (see FIG. 8).

(Other Variation)

All of the springs as described above include the interlocking members 64a and 64b provided on the both right and left sides of the actuating member 63, that is, include the four point-of-action portions 70. In contrast, it is possible to provide the interlocking members 64a and 64b respectively on the both sides with the supporting axes 65 interposed therebetween, and the actuating members 63 respectively on the both sides with the interlocking members 64a and 64b interposed therebetween. According to such a structure, the two point-of-action portions 70 can be provided.

Further, the spring according to one or more embodiments of the present invention can be manufactured by punching a thin leaf spring material, as long as it is within a manufacturable size.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A structure of a spring, comprising:
    a supporting member;
    an actuating member that is rotatably supported to the supporting member by a first supporting axis at a portion near a center; and
    a plurality of interlocking members that are each provided on both sides of the first supporting axis, that are rotatably supported to the supporting member by a second supporting axis, and that are rotatably coupled to the actuating member,
    each point of action of the interlocking members being defined at a portion that is closer to the first supporting axis than to the coupled portion of the second supporting axis and the actuating member.

2. The structure of the spring according to claim 1, wherein the interlocking members are rotatably supported to the supporting member at a portion that is closer to the first supporting axis than to the coupled portion to the actuating member.

3. The structure of the spring according to claim 1, wherein the interlocking members are rotatably supported to the supporting member at a portion that is distant from the coupled portion to the actuating member, taking the first supporting axis as a reference.

4. The structure of the spring according to claim 1, wherein at least one of an area in which the interlocking members are coupled to the actuating member, an area in which the actuating member is supported by the first supporting axis, and an area in which the interlocking member is supported by the second supporting axis, is configured as a reinforcement portion, a thickness of the reinforcement portion being made thicker than a thickness of the area other than the reinforcement portion.

5. The structure of the spring according to claim 4,
    wherein each of the interlocking members includes:
        an interlocking member main body whose one end is rotatably coupled to the actuating member and the other end is supported to the supporting member by the second supporting axis; and
        a point-of-action spring portion whose point of action is defined at the one end, and
    wherein the reinforcement portion that is thicker than the thickness of the area other than the reinforcement portion is formed at the coupling area between the interlocking member main body and the point-of-action spring portion.

6. The structure of the spring according to claim 5, wherein the spring is manufactured with an SOI substrate,
    the reinforcement portion is manufactured using an entire thickness of the SOI substrate, and
    the other portion is manufactured using a part of the thickness of the SOI substrate.

7. The structure of the spring according to claim 4, wherein the spring is manufactured with an SOI substrate,
    the reinforcement portion is manufactured using an entire thickness of the SOT substrate, and
    the other portion is manufactured using a part of the thickness of the SOI substrate.

8. The structure of the spring according to claim 1, wherein each of the interlocking members includes:
    an elastic expanding and contracting portion that elastically expands and contracts in the middle of the coupled portion to the actuating member and the second supporting axis.

9. The structure of the spring according to claim 1, wherein the spring is in a symmetric structure with respect to the first supporting axis, and in a symmetric structure with respect to a line segment that extends in a direction orthogonal to the first supporting axis.

10. An actuator, comprising:
    the spring according to claim 1; and
    a driving source that drives the actuating member of the spring to rotate about the first supporting axis.

11. A relay, comprising:
the spring according to claim 1;
a driving source that drives the actuating member of the spring to rotate about the first supporting axis;
a plurality of moving contacts that are provided for an area serving as the point of action of the spring;
a first fixed contact that is provided at a position that faces one of the moving contacts;
a second fixed contact that is provided at a position that faces another one of the moving contacts; and
a third fixed contact that is provided at a position that faces both of the adjacent moving contacts.

\* \* \* \* \*